United States Patent
Miura et al.

(10) Patent No.: US 9,525,057 B2
(45) Date of Patent: Dec. 20, 2016

(54) SEMICONDUCTOR DEVICE

(71) Applicants: Naruhisa Miura, Tokyo (JP); Shiro Hino, Tokyo (JP); Akihiko Furukawa, Tokyo (JP); Yuji Abe, Tokyo (JP); Shuhei Nakata, Tokyo (JP); Masayuki Imaizumi, Tokyo (JP); Yasuhiro Kagawa, Tokyo (JP)

(72) Inventors: Naruhisa Miura, Tokyo (JP); Shiro Hino, Tokyo (JP); Akihiko Furukawa, Tokyo (JP); Yuji Abe, Tokyo (JP); Shuhei Nakata, Tokyo (JP); Masayuki Imaizumi, Tokyo (JP); Yasuhiro Kagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/400,025

(22) PCT Filed: Mar. 12, 2013

(86) PCT No.: PCT/JP2013/056785
§ 371 (c)(1),
(2) Date: Nov. 10, 2014

(87) PCT Pub. No.: WO2013/172079
PCT Pub. Date: Nov. 21, 2013

(65) Prior Publication Data
US 2015/0108564 A1 Apr. 23, 2015

(30) Foreign Application Priority Data

May 15, 2012 (JP) .................................. 2012-111266
Nov. 5, 2012 (JP) .................................. 2012-243304

(51) Int. Cl.
*H01L 29/08* (2006.01)
*H01L 29/78* (2006.01)
(Continued)

(52) U.S. Cl.
CPC ......... *H01L 29/7802* (2013.01); *H01L 21/046* (2013.01); *H01L 29/086* (2013.01);
(Continued)

(58) Field of Classification Search
CPC ......... H01L 29/0615–29/0634; H01L 29/7801;
H01L 29/7811; H01L 29/7827–29/783;
H01L 29/1095; H01L 29/1608; H01L
29/66068; H01L 29/7802; H01L
29/66325; H01L 29/7394; H01L 29/7395;
H01L 29/0696; H01L 29/7836; H01L
29/7833; H01L 29/66893; H01L 29/8083;
H01L 29/086
See application file for complete search history.

(56) References Cited

U.S. PATENT DOCUMENTS 5,438,220 A * 8/1995 Nakagawa ............. H01L 21/74
257/487
6,169,299 B1 * 1/2001 Kawaji ................ H01L 29/0649
257/137
(Continued)

FOREIGN PATENT DOCUMENTS

CN 1329367 A1 1/2013
JP 62 266871 11/1987
(Continued)

OTHER PUBLICATIONS

International Preliminary Report on Patentability and Written Opinion issued Nov. 27, 2014 in PCT/JP2013/056785 (with English language translation).
(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

A source region of a MOSFET includes: a source contact region connected to a source pad; a source extension region adjacent to a channel region in a well region; and a source resistance control region arranged between the source extension region and the source contact region. The source resistance control region is different in an impurity concentration from the source extension region and the source contact region. These three regions are connected in series between the source pad and the channel region in the well region.

17 Claims, 25 Drawing Sheets

(51) Int. Cl.
- *H01L 21/04* (2006.01)
- *H01L 29/10* (2006.01)
- *H01L 29/423* (2006.01)
- *H01L 29/06* (2006.01)
- *H01L 29/66* (2006.01)
- *H01L 29/808* (2006.01)
- *H01L 29/16* (2006.01)

(52) U.S. Cl.
CPC ...... *H01L 29/1033* (2013.01); *H01L 29/1095* (2013.01); *H01L 29/42356* (2013.01); *H01L 29/66068* (2013.01); *H01L 29/7813* (2013.01); *H01L 29/7827* (2013.01); *H01L 29/7836* (2013.01); *H01L 29/0615* (2013.01); *H01L 29/0619* (2013.01); *H01L 29/1608* (2013.01); *H01L 29/66893* (2013.01); *H01L 29/8083* (2013.01)

(56) References Cited

U.S. PATENT DOCUMENTS

| | | | |
|---|---|---|---|
| 6,528,850 B1* | 3/2003 | Hebert | H01L 21/26513 257/331 |
| 6,573,534 B1* | 6/2003 | Kumar | H01L 29/1608 257/328 |
| 6,933,565 B2 | 8/2005 | Matsumoto et al. | |
| 7,393,731 B2 | 7/2008 | Matsumoto et al. | |
| 7,492,011 B2 | 2/2009 | Suzuki et al. | |
| 7,569,900 B2 | 8/2009 | Imai et al. | |
| 7,795,691 B2 | 9/2010 | Zhang et al. | |
| 7,838,349 B2 | 11/2010 | Matsumoto et al. | |
| 2001/0050397 A1 | 12/2001 | Matsumoto et al. | |
| 2004/0104429 A1* | 6/2004 | Takahashi | H01L 29/0623 257/338 |
| 2005/0253219 A1 | 11/2005 | Matsumoto et al. | |
| 2006/0102908 A1* | 5/2006 | Imai | H01L 29/086 257/77 |
| 2006/0255373 A1* | 11/2006 | Elpelt | H01L 29/0634 257/256 |
| 2006/0273398 A1 | 12/2006 | Suzuki et al. | |
| 2007/0007537 A1* | 1/2007 | Ogura | H01L 29/7828 257/77 |
| 2007/0034941 A1 | 2/2007 | Francis et al. | |
| 2008/0166849 A1* | 7/2008 | Yang | H01L 29/0847 438/305 |
| 2008/0224150 A1* | 9/2008 | Suzuki | H01L 21/0465 257/77 |
| 2008/0274596 A1 | 11/2008 | Matsumoto et al. | |
| 2009/0189228 A1* | 7/2009 | Zhang | H01L 29/1095 257/402 |
| 2009/0236612 A1* | 9/2009 | Nakamura | H01L 21/046 257/77 |
| 2011/0278599 A1* | 11/2011 | Nakao | H01L 21/0465 257/77 |
| 2011/0284874 A1* | 11/2011 | Miura | H01L 29/4916 257/77 |
| 2011/0306188 A1* | 12/2011 | Kawai | H01L 21/268 438/482 |
| 2013/0285070 A1* | 10/2013 | Kawai | H01L 21/0455 257/77 |

FOREIGN PATENT DOCUMENTS

| | | |
|---|---|---|
| JP | 4-11780 | 1/1992 |
| JP | 04011780 A * | 1/1992 |
| JP | 4 196174 | 7/1992 |
| JP | 9-283755 | 10/1997 |
| JP | 11 312807 | 11/1999 |
| JP | 2003 332577 | 11/2003 |
| JP | 2006 120894 | 5/2006 |
| JP | 2006 173584 | 6/2006 |
| JP | 2007-335463 | 6/2006 |
| JP | 2006-339444 | 12/2006 |
| JP | 2009 177182 | 8/2009 |
| JP | 2009 231545 | 10/2009 |

OTHER PUBLICATIONS

International Search Report Issued Jun. 4, 2013 in PCT/JP13/056785 Filed Mar. 12, 2013.

Office Action mailed Mar. 15, 2016 for Japanese Patent Application No. 2014-515523 and English translation of relevant portions thereof.

Chinese Office Action for Chinese Application No. CN 2016052701397010 dated Jun. 1, 2016 and English translation of relevant portions thereof.

Office Action dated Sep. 13, 2016 for Japanese Patent Application No. 2014-515523 and English translation of relevant portions therof.

* cited by examiner

F I G . 1
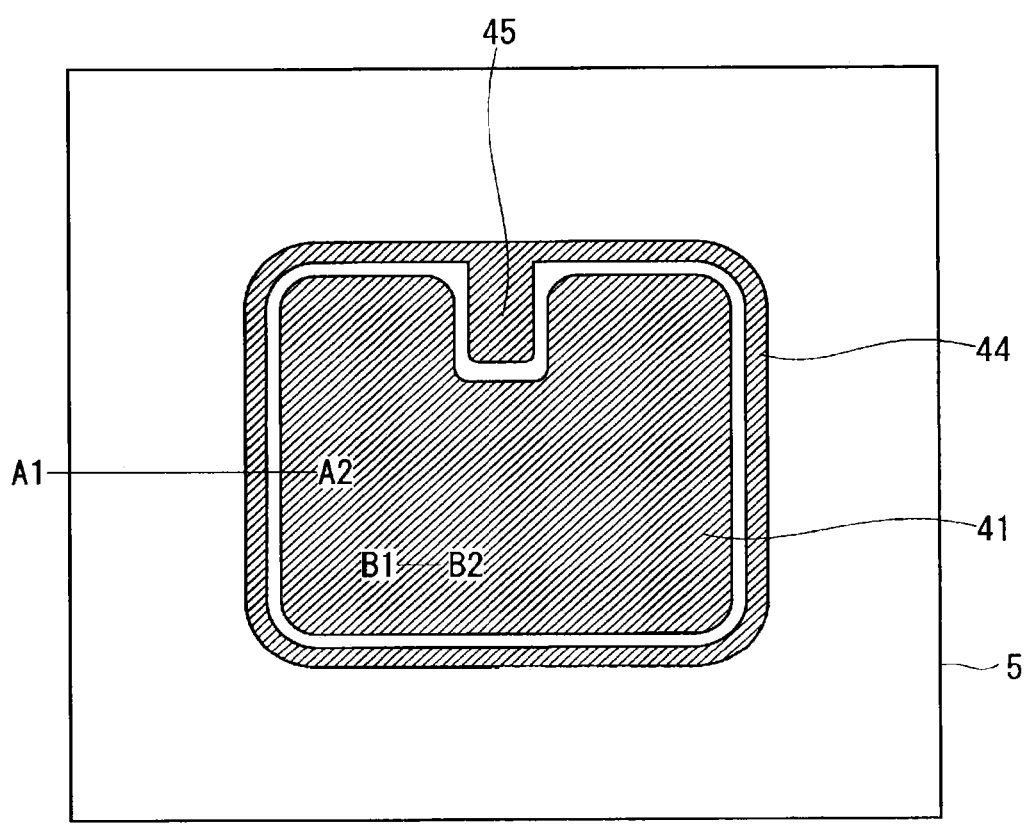

F I G . 2
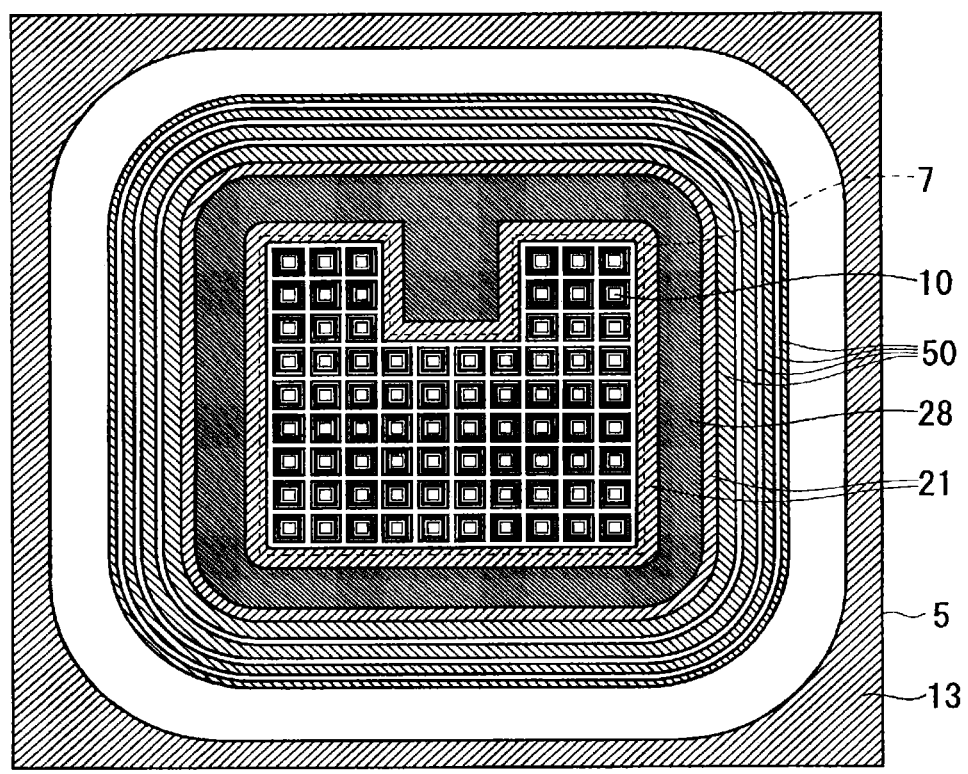

F I G. 8
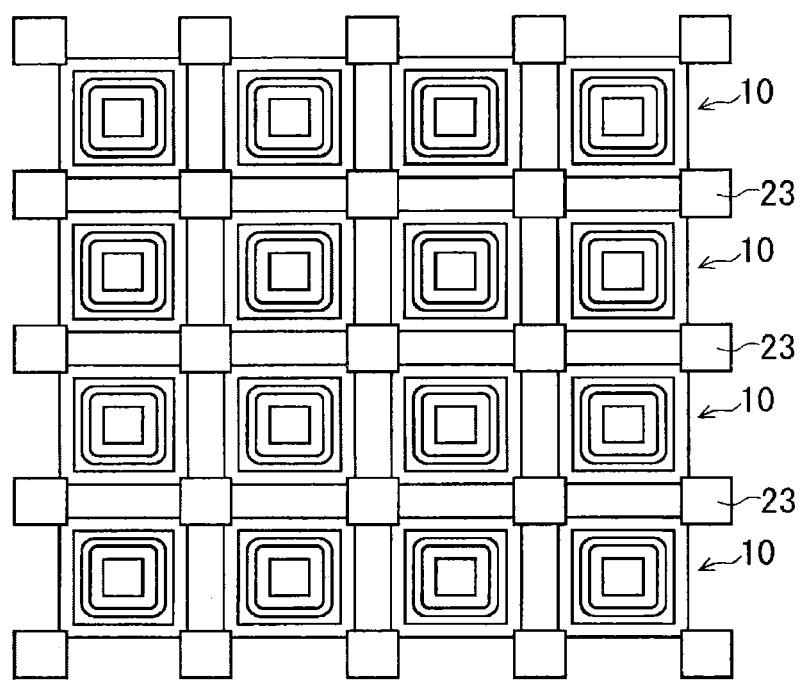

F I G. 9
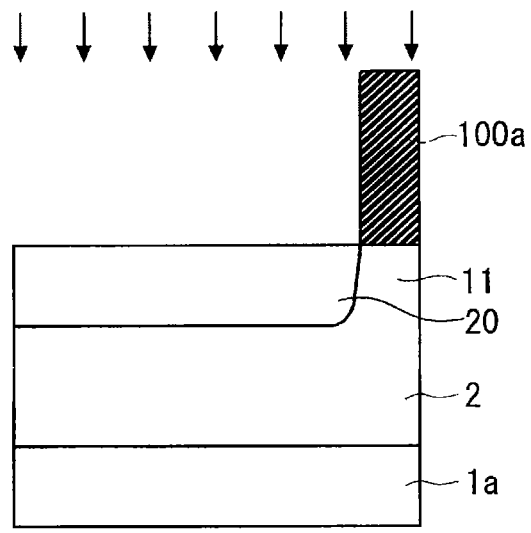
F I G. 10
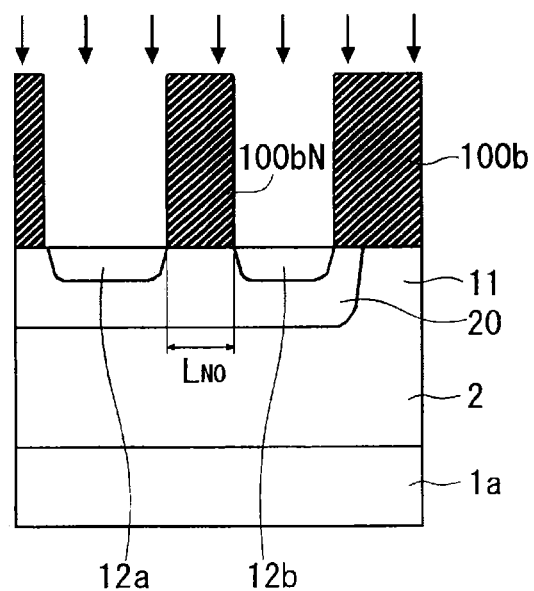

F I G. 1 8
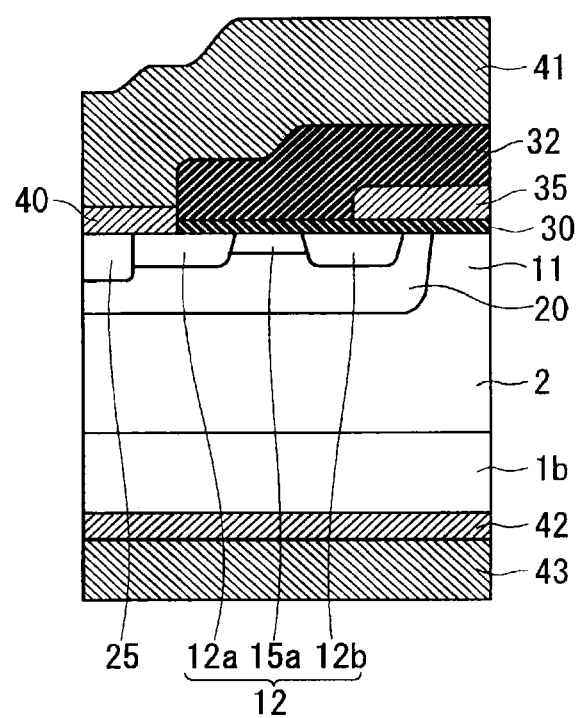

|  | SOURCE RESISTANCE CONTROL REGION | CHANNEL LENGTH [μm] | THRESHOLD VOLTAGE [V] | ON RESISTANCE [mΩcm²] |
|---|---|---|---|---|
| ELEMENT A | YES | 0.4 | 2.5 | 16 |
| ELEMENT B | NO | 0.4 | 2.3 | 8 |
| ELEMENT C | NO | 0.8 | 3.6 | 15 |

SEMICONDUCTOR DEVICE

TECHNICAL FIELD

The present invention relates to the structure of a semiconductor device and a method of manufacturing the same.

BACKGROUND ART

A semiconductor element including a silicon carbide (SiC) semiconductor as a base material has attracted attention as a device capable of achieving a high breakdown voltage and low loss. In particular, a field-effect transistor (metal-oxide semiconductor field effect transistor; MOSFET) with a metal-insulator-semiconductor junction has been requested to achieve higher reliability in terms of its application to power electronics.

As an example, if such a semiconductor element is applied to an inverter circuit and the like and an inductive load or a resistive load operates therein, a high voltage as a power source voltage may be applied to a drain of the element in an ON condition as a result of the occurrence of a load short-circuit such as an arm short-circuit. In this case, a high-current may flow into this element. This condition induces a drain current of several times to several tens of times higher than a rated current. This leads to breakdown of the element if the element does not have an appropriate protective function.

In order to obviate the element breakdown, an excessive drain current (overcurrent) should be interrupted by detecting this drain current and inputting an OFF signal to a gate electrode in response to the detection before the element breakdown occurs. Thus, the element is required to have robustness that does not cause the element breakdown over a period of time or longer than this period from when the overcurrent is detected at the occurrence for example of a load short-circuit until when the OFF signal is input to the gate electrode. Specifically, the element is strongly desired to have a high short-circuit tolerance. The short-circuit tolerance is determined as a period of time from when a load short-circuit or the like occurs until when element breakdown occurs.

Patent literature 1 discloses a technique of enhancing the short-circuit tolerance of an IGBT (insulated gate bipolar transistor) as a typical power device. The IGBT of patent literature 1 has a structure where an emitter layer to become a path for an ON current includes a high-resistance emitter layer (high-resistance region) and a low-resistance emitter layer (low-resistance region) that are connected in parallel to each other between an emitter electrode and a channel region. In this structure, the occurrence of a load short-circuit causes flow of an electron current in the emitter layer to increase voltage drop. This reduces a saturation current value to enhance the short-circuit tolerance. The low-resistance region reduces a contact resistance between the emitter electrode and the emitter layer, thereby achieving a low ON voltage.

PRIOR ART LITERATURES

Patent Literature

Patent Literature 1: Japanese Patent Application Laid-Open No. 2003-332577

SUMMARY OF INVENTION

Problems to be Solved by Invention

Like in patent literature 1, if the emitter layer includes the parallel-connected high-resistance region and the low-resistance region, the resistance value of the entire emitter layer is substantially determined by the resistance value of the low-resistance region. This does not generate large voltage drop across the channel region and the emitter electrode, so that the effect of reducing a saturation current might not be achieved satisfactorily. The emitter electrode is connected not only to the low-resistance region but also to the high-resistance region. This makes an effective contact resistance higher than that achieved by the connection only to the low-resistance region.

The present invention has been made to solve the aforementioned problems. It is an object of the present invention to provide a semiconductor device capable of enhancing a short-circuit tolerance by generating large voltage drop across a channel region and a source electrode and capable of maintaining a contact resistance low between the source electrode and a source region.

Means of Solving Problems

A semiconductor device of the present invention includes: a semiconductor substrate; a drift layer of a first conductivity type formed on the semiconductor substrate; a well region of a second conductivity type selectively formed in a superficial area of the drift layer; a source region of the first conductivity type formed in a superficial area in the well region; a JFET region being a part of the drift layer and adjacent to the well region; a channel region being a part of the well region and defined between the source region and the JFET region; a gate electrode arranged over the drift layer while a gate insulating film is arranged between the drift layer and the gate electrode, the gate electrode extending over the source region, the channel region, and the JFET region; a source electrode connected to the source region; and a drain electrode formed on a back surface of the semiconductor substrate. The source region includes: a source contact region connected to the source electrode; a source extension region adjacent to the channel region; and a source resistance control region arranged between the source extension region and the source contact region. The source resistance control region is different in an impurity concentration of the first conductivity type from the source extension region and the source contact region. The source contact region and the source extension region have the same distribution of an impurity concentration. The gate electrode overlaps only the source extension region of the source region.

Advantageous Effects of Invention

The semiconductor device of the present invention has a structure where the source resistance control region is connected in series between the channel region and the source electrode. This allows adjustment of voltage drop in the source region while a load short-circuit occurs in the semiconductor device. Increasing the voltage drop reduces a saturation current value of the semiconductor device to enhance a short-circuit tolerance. A part of the source region where the source region is connected to the source electrode does not include the source resistance control region but it includes a low-resistance source contact region. This can maintain a contact resistance low between the source electrode and the source region. Arranging the source resistance control region between the low-resistance source contact region and the source extension region can determine the length of the source resistance control region accurately.

BRIEF DESCRIPTION OF DRAWINGS

FIG. 1 is a top view of a semiconductor device of a first embodiment.

FIG. 2 is a top view showing a surface structure of a drift layer of the semiconductor device of the first embodiment.

FIG. 8 is a top view showing a modification of the layout of the unit cells of the semiconductor device of the first embodiment.

FIG. 9 is a vertical sectional view showing a method of manufacturing the semiconductor device of the first embodiment.

FIG. 10 is a vertical sectional view showing the method of manufacturing the semiconductor device of the first embodiment.

FIG. 18 is a vertical sectional view showing a modification of the semiconductor device of the first embodiment.

DESCRIPTION OF EMBODIMENT(S)

Figure 3:
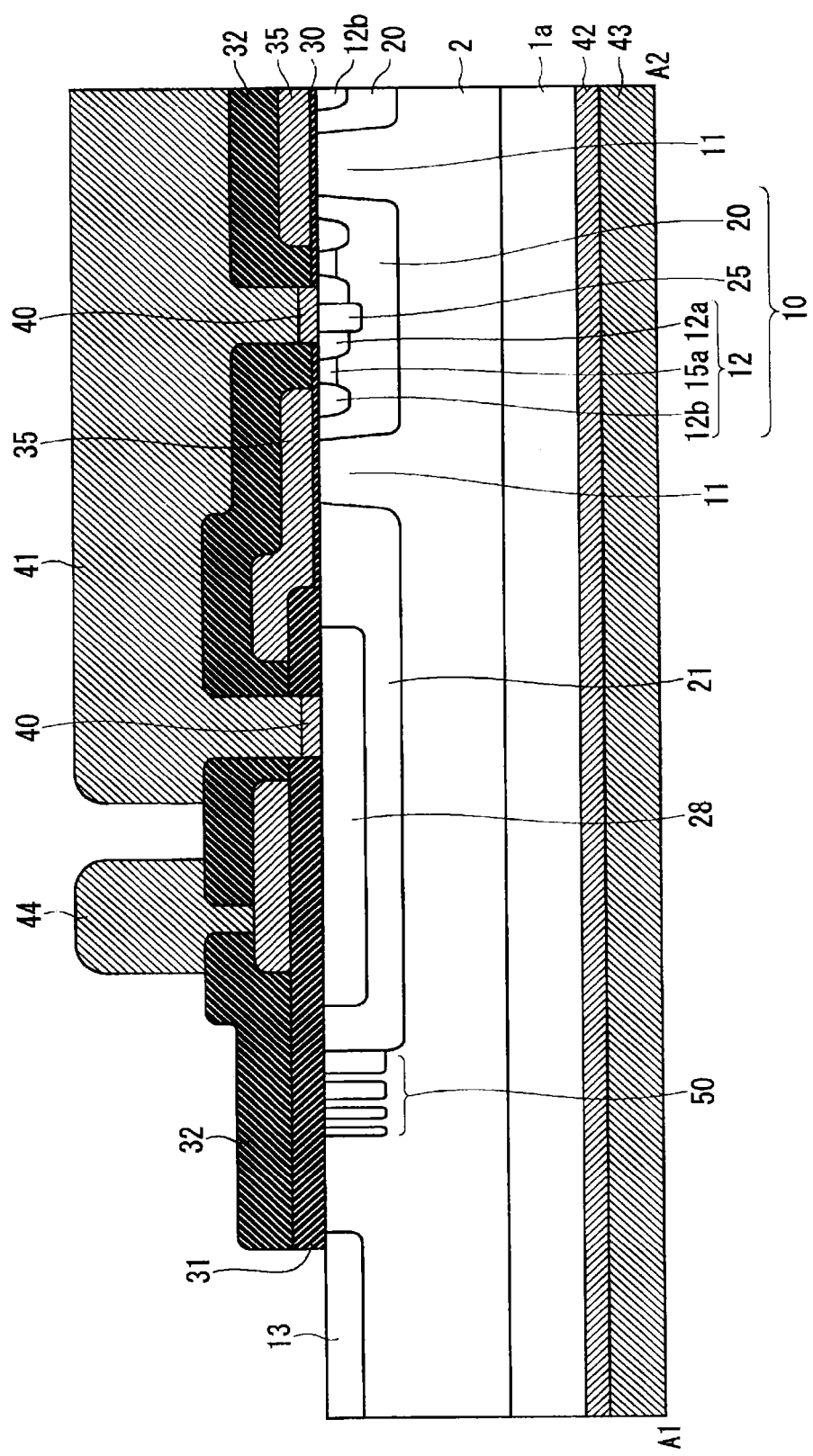
FIG. 3 is a vertical sectional view taken at a peripheral part of the semiconductor device of the first embodiment.

In embodiments described below, regarding definition of the conductivity of impurities, an n-type is defined as a "first conductivity type" and a p-type is defined as a "second conductivity type." These types may be defined conversely. Specifically, the p-type may be defined as the "first conductivity type" and the n-type may be defined as the "second conductivity type."

In the present specification, each semiconductor element is called a "semiconductor device" in a narrow sense. Meanwhile, in a broad sense, the "semiconductor device" further includes a semiconductor module (a power module such as an inverter module, for example) formed by mounting a semiconductor element chip, a free-wheeling diode connected in inverse parallel to this semiconductor element and a control circuit to apply a voltage to a gate electrode of this semiconductor element, and sealing the chip, the free-wheeling diode and the control circuit integrally.

First Embodiment

FIG. 1 schematically shows the structure of an upper surface of a silicon carbide MOSFET as a semiconductor device of a first embodiment. FIG. 2 shows the structure of an extreme surface of a semiconductor layer of this semiconductor device. Specifically, this semiconductor device includes each element of FIG. 1 formed on the semiconductor layer of FIG. 2.

As shown in FIG. 1, a source pad (source electrode) 41, a gate interconnect 44, and a gate pad 45 are formed in the upper surface of a chip 5 of the semiconductor device. The gate pad 45 is arranged near the center of one side of the chip 5. The gate interconnect 44 is connected to the gate pad 45 and is formed so as to surround the source pad 41.

A region 7 surrounded by dotted lines of FIG. 2 is an active region 7 where multiple unit cells 10 of the MOSFET are arranged in parallel. The source pad 41 is formed so as to cover the active region 7 from above.

Gate electrodes of the unit cells 10 are connected through the gate interconnect 44 to the gate pad 45. A gate voltage applied from an external control circuit (not shown in the drawings) to the gate pad 45 is transmitted to the gate electrode of each unit cell 10. Likewise, a source region of each unit cell 10 is connected to the source pad 41.

As shown in FIG. 2, a terminal well region 21, a terminal low-resistance region 28, and an FLR (field limiting ring) region 50 described later are formed in a region (terminal region) outside the active region 7 so as to surround the active region 7. The terminal low-resistance region 28 is formed inside the terminal well region 21. The FLR region 50 is formed at the outer end of the terminal well region 21. A field stop region 13 is formed apart from the FLR region 50 so as to surround the FLR region 50 from outside. The outer circumference of the field stop region 13 extends as far as to an end portion of the chip 5.

In many actual products of the semiconductor device, respective electrodes for a temperature sensor and a current sensor to operate an external protection circuit are provided to the chip 5. These electrodes are not related strongly to the present invention, so that they are omitted in this embodiment. A layout of the gate pad 45, the gate interconnect 44, and the source pad 41 is not limited to that shown in FIG. 1. The gate pad 45, the gate interconnect 44, and the source pad 41 are changed in various ways for example in their shapes or in their numbers depending on products. The presence or absence of the electrodes for a temperature sensor and a current sensor and a layout of these electrodes may be determined arbitrarily as they have little influence on the effect of the present invention FIG. 3 is a vertical sectional view schematically showing the structure of a peripheral part of the semiconductor device (silicon carbide MOSFET) of the first embodiment. FIG. 3 corresponds to a cross section taken along A1-A2 of FIG. 1. FIG. 3 shows a unit cell 10 in the outermost circumference and the terminal region outside this unit cell 10.

As shown in FIG. 3, this MOSFET is formed by using an epitaxial substrate including a semiconductor substrate 1a made of silicon carbide of the first conductivity type (n-type) and a drift layer 2 of the first conductivity type (silicon carbide semiconductor layer) epitaxially grown on a front surface of the semiconductor substrate 1a. A drain electrode 43 is formed on a back surface side of the semiconductor substrate 1a through an ohmic electrode 42 to form ohmic contact with the semiconductor substrate 1a.

Multiple well regions 20 of the second conductivity type (p-type) are selectively formed in a superficial area of the drift layer 2 in the active region 7. A part 11 adjacent to the well region 20 in the superficial area in the drift layer 2 is called a "JFET region."

A source region 12 of the first conductivity type is selectively formed in a superficial area of the well region 20. A part of the well region 20 between the source region 12 and the JFET region 11 is called a "channel region" in which a channel is formed when the MOSFET is turned on.

As shown in FIG. 3, the source region 12 is formed of a source contact region 12a, a source extension region 12b, and a source resistance control region 15a each having the first conductivity type. The source contact region 12a is connected to the source pad 41 through an ohmic electrode 40 that forms ohmic contact with this source contact region 12a. The source resistance control region 15a is formed so as to surround the source contact region 12a from outside. The source extension region 12b is formed so as to surround the source resistance control region 15a from outside. The source extension region 12b is the outermost circumferential part of the source region 12 and is adjacent to the channel region.

The source resistance control region 15a is set to be lower in impurity concentration than the source contact region 12a and the source extension region 12b. The source contact region 12a and the source extension region 12b may be substantially the same in impurity concentration. As described later, the source contact region 12a and the source extension region 12b can be formed simultaneously. In this case, the source contact region 12a and the source extension region 12b are to have the same impurity distribution.

A well contact region 25 of the second conductivity type to be connected to the source pad 41 through the ohmic electrode 40 is formed inside the source contact region 12a.

The well contact region 25 penetrates the source contact region 12a to reach the well region 20, thereby electrically connecting the source pad 41 and the well region 20.

A gate electrode 35 is formed over the drift layer 2 while a gate insulating film 30 is arranged between the drift layer 2 and the gate electrode 35. The gate electrode 35 extends over the source extension region 12b, the well region 20 (channel region), and the JFET region 11. The source extension region 12b out of the three regions forming the source region 12 forms a MOS structure together with the gate insulating film 30 and the gate electrode 35.

The terminal well region 21 of the second conductivity type is formed in a superficial area of the drift layer 2 in a region (terminal region) outside the active region 7. The terminal low-resistance region 28 of the second conductivity type to be connected to the source pad 41 through the ohmic electrode 40 is formed in a superficial area of the terminal well region 21. As a result, the source pad 41 is connected to the source contact region 12a and is further connected electrically to the well region 20 and the terminal well region 21 through the well contact region 25 and the terminal low-resistance region 28 respectively. The terminal well region 21 and the well region 20 can be formed simultaneously. In this case, the terminal well region 21 and the well region 20 are to have the same impurity distribution.

The FLR region 50 of the second conductivity type is formed in the superficial area of the drift layer 2 in an outer circumferential part of the terminal well region 21. The field stop region 13 of the first conductivity type is formed apart from the terminal well region 21 so as to surround the FLR region 50 from outside.

A field oxide film 31 is formed on a surface of the terminal region of the drift layer 2 where the gate insulating film 30 is not formed. A part of the gate electrode 35 extends as far as to a position above the field oxide film 31 where the gate electrode 35 and the gate interconnect 44 are connected.

The gate electrode 35 is covered with an interlayer insulating film 32 from above. The source pad 41, the gate interconnect 44, and the gate pad 45 are formed on the interlayer insulating film 32. The interlayer insulating film 32 is provided with contact holes (source contact holes) to connect the source pad 41 to the source contact region 12a, the well contact region 25, and the terminal low-resistance region 28. The interlayer insulating film 32 is also provided with a contact hole (gate contact hole) to connect the gate interconnect 44 to the gate electrode 35.

Figure 4:
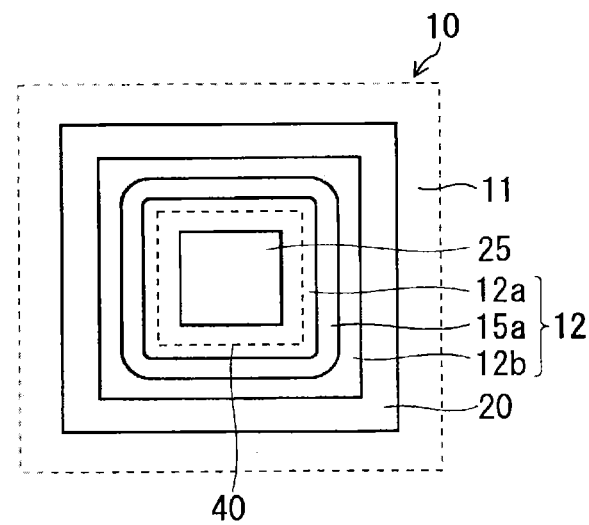
FIG. 4 is a top view showing a surface structure of the drift layer in a unit cell of the semiconductor device of the first embodiment.

FIG. 4 schematically shows a planar structure of an extreme surface area of the unit cell 10. As described previously, the source region 12 of the unit cell 10 is formed of the three regions including the source contact region 12a, the source extension region 12b, and the source resistance control region 15a between the source contact region 12a and the source extension region 12b.

Dotted lines shown in the source contact region 12a of FIG. 4 indicate a formation region (contact hole) for the ohmic electrode 40 to connect the source pad 41 to the unit cell 10. The ohmic electrode 40 contacts only the source contact region 12a of the aforementioned three regions. As a result, the source contact region 12a, the source resistance control region 15a, and the source extension region 12b are connected in series between the ohmic electrode 40 and the channel region in the well region 20. The source contact region 12a has a high impurity concentration. This forms ohmic contact of a low contact resistance with the ohmic electrode 40.

A drain current (ON current) flowing from the drain electrode 43 into the drift layer 2 during ON operation of the MOSFET or on the occurrence of a load short-circuit follows the path as follows: the drain current passes through the JFET region 11 and the channel region formed in a surface area (channel region) of the well region 20, then passes through the source extension region 12b, the source resistance control region 15a and the source contact region 12a, and then flows into the source electrode 41 from the ohmic electrode 40.

In each unit cell 10, the source resistance control region 15a is formed so as to have a uniform length (path length for a current) in a direction in which the ON current flows, specifically in a direction from the source extension region 12b toward the source contact region 12a. In particular, each corner area of the outer circumference of the source contact region 12a (the inner circumference of the source resistance control region 15a) and each corner area of the inner circumference of the source extension region 12b (the outer circumference of the source resistance control region 15a) have a rounded shape. Further, the outer circumference of the source contact region 12a and the inner circumference of the source extension region 12b have the same center of a radius of curvature. Making the length of the source resistance control region 15a uniform in this way in the unit cell 10 suppresses variation in a source resistance. This can prevent intensive flow of a current into a particular area to occur as a result of instantaneous application of an excessive current such as a short-circuit current, leading to enhanced reliability of the semiconductor device. An experimental result showing this effect will be described later.

The outer circumference of the source extension region 12b may also have a rounded corner area and may have the center of a radius of curvature same as that of the outer circumference of the source contact region 12a and that of the inner circumference of the source extension region 12b. In this case, the parasitic resistance of the source extension region 12b becomes uniform in the unit cell 10.

The outer circumference of the well region 20 may also have a rounded corner area and may have the center of a radius of curvature same as that of the outer circumference of the source contact region 12a and that of the inner circumference of the source extension region 12b, thereby achieving a uniform channel length. In this case, a channel resistance becomes uniform and variation in element characteristics and variation in a current distribution are suppressed, so that the structure of the unit cell 10 becomes more reliable.

Figure 5:
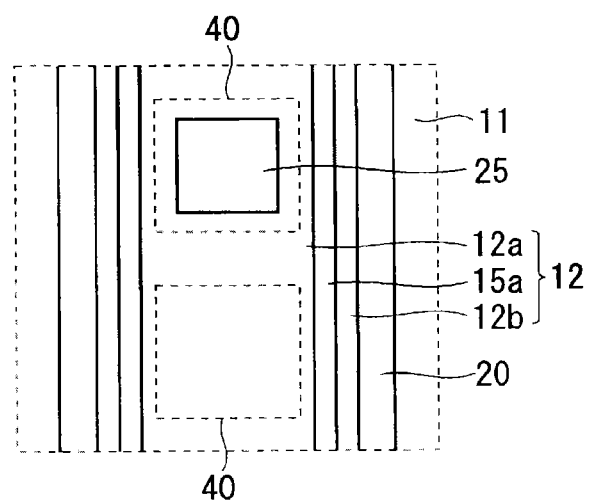
FIG. 5 is a top view showing a modification of the unit cell of the semiconductor device of the first embodiment.

FIG. 4 shows the unit cell 10 having a rectangular planar structure. The unit cell 10 may have any shape such as a hexagon, an octagon or a circle, for example. The MOSFET is not always required to have a cell structure with multiple unit cells 10 but it may also have a comb-like structure such as that shown in FIG. 5. Generally, the comb-like structure can be formed easily. Meanwhile, the comb-like structure has a channel width density lower than that of the cell structure, so that the comb-like structure leads to a relatively high ON resistance of the element.

Figure 6:
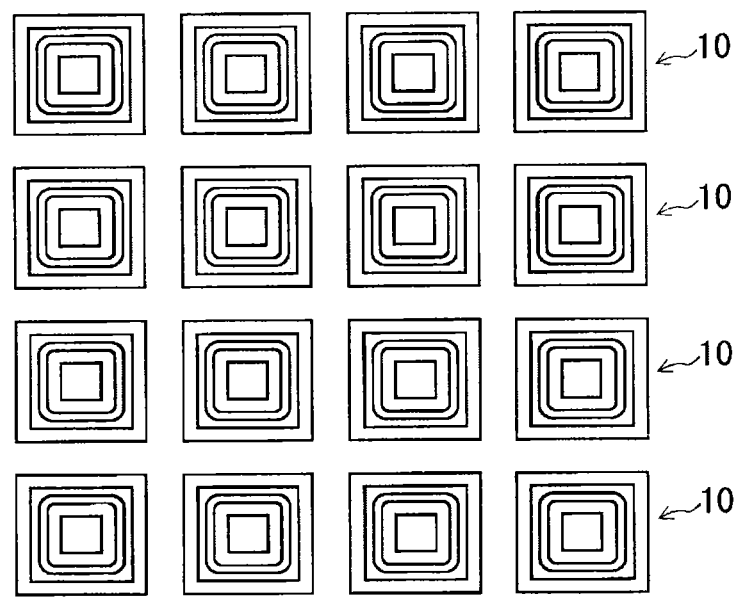
FIG. 6 is a top view showing a layout of the unit cells of the semiconductor device of the first embodiment.
Figure 7:
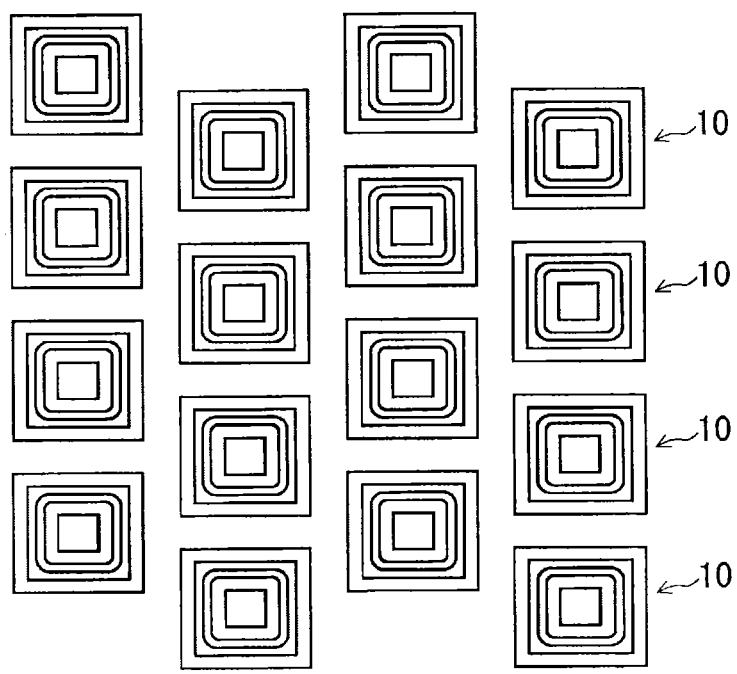
FIG. 7 is a top view showing a modification of the layout of the unit cells of the semiconductor device of the first embodiment.

This embodiment is based on the assumption that the multiple unit cells 10 are arranged in a matrix as shown in FIG. 6. Alternatively, the unit cells 10 may be arranged alternately (in a zigzag pattern) as shown in FIG. 7, for example.

In the arrangement of FIG. 6, a high electric field may be generated easily in the gate insulating film on the corner area of each well region 20 in response to application of a reverse bias to the drain electrode of the MOSFET. This may affect the reliability of the semiconductor device. Thus, as shown in FIG. 8, well bridge regions 23 of the second conductivity type may be formed to become intermediaries between the corner areas of the well regions 20. The well bridge regions 23 may be formed in a step different from the step of forming the well regions 20. Meanwhile, forming the well bridge regions 23 simultaneously with the well regions 20 during ion implantation for forming the well regions 20 suppresses increase of the number of mask pattern forming steps and that of ion implantation steps, thereby achieving reduction in cost for manufacturing the semiconductor device.

A method of manufacturing the semiconductor device (silicon carbide MOSFET) of the first embodiment is described next. FIGS. 9 to 14 are views of steps describing this manufacturing method. FIGS. 9 to 14 correspond to vertical sections of the right half of one of the multiple unit cells 10 arranged in the active region 7. Specifically, FIGS. 9 to 14 do not include the terminal region and show a cross section (along line B1-B2 of FIG. 1) at an arbitrary position in a region inside the active region 7.

First, the semiconductor substrate 1a made of silicon carbide of the first conductivity type is prepared. The semiconductor substrate 1a may be formed of a wide bandgap semiconductor wider in bandgap than silicon different silicon carbide. Examples of the wide bandgap semiconductor include silicon carbide and additionally, gallium nitride, aluminum nitride, and diamond. The plane direction of the semiconductor substrate 1a may be determined arbitrarily. As an example, a direction vertical to a surface of the semiconductor substrate 1a may be tilted to eight degrees or less relative to the c-axis direction or may not be tilted. The thickness of the semiconductor substrate 1a may also be determined arbitrarily. As an example, the thickness may be about 350 μm or about 100 μm.

Next, the drift layer 2 of the first conductivity type is formed by epitaxial crystal growth on the semiconductor substrate 1a. The impurity concentration of the first conductivity type in the drift layer 2 is from about $1 \times 10^{13}$ to about $1 \times 10^{18}$ cm$^{-3}$. The thickness of the drift layer 2 is set to be from 3 to 200 μm.

It is desirable that a distribution of the impurity concentration in the drift layer 2 be constant in a thickness direction. However, this distribution may not be constant. As an example, the impurity concentration may be made high or conversely, may be made low intentionally in a surface and its vicinity. Making the impurity concentration high in the surface and its vicinity of the drift layer 2 achieves the effect of reducing the resistance of the JFET region 11 to be formed later and the effect of enhancing channel mobility and additionally, allows the threshold voltage of the element to be set low. Making the impurity concentration low in the surface and its vicinity of the drift layer 2 reduces an electric field to be generated in the gate insulating film 30 in response to application of a reverse bias to the element and enhances the reliability of the element and further, allows the threshold voltage of the element to be set high.

Next, as shown in FIG. 9, an implantation mask 100a (a resist or a silicon oxide film, for example) processed by photolithography is formed. Then, the well region 20 of the second conductivity type is formed by selective ion implantation using the implantation mask 100a. At the same time, the terminal well region 21 is formed in the terminal region (not shown in FIG. 9). It is preferable that the semiconductor substrate 1a be heated from 100° C. to 800° C. during the ion implantation. Alternatively, the semiconductor substrate 1a may not be overheated. Appropriate n-type impurities (dopants) to be ion implanted are nitrogen or phosphorus. Appropriate p-type impurities (dopants) to be ion implanted are aluminum or boron.

The depth of the bottom of the well region 20 should be set such that the bottom of the well region 20 does not become deeper than the bottom of the drift layer 2. The depth of the bottom of the well region 20 is from about 0.2 to about 2.0 μm, for example. The maximum impurity concentration in the well region 20 is set in a range for example from $1 \times 10^{15}$ to about $1 \times 10^{19}$ cm$^{-3}$ to exceed the impurity concentration in the surface and its vicinity of the drift layer 2. In order to enhance the conductivity of the channel region, the impurity concentration of the second conductivity type in the well region 20 may be lower than that of the first conductivity type in the drift layer 2 only in the extreme surface and its vicinity of the drift layer 2.

Then, the FLR region 50 of the second conductivity type is formed in the terminal region (not shown in FIG. 9). The FLR region 50 is also formed by selective ion implantation using a mask (a resist or a silicon oxide film, for example) processed by photolithography.

Next, as shown in FIG. 10, the source contact region 12a of the first conductivity type and the source extension region 12b of the first conductivity type are formed by selective ion implantation using an implantation mask 100b and an implantation mask 100bN (a resist or a silicon oxide film) processed by photolithography. At the same time, the field stop region 13 of the first conductivity type is formed in the terminal region (not shown in FIG. 10).

The respective depths of the bottoms of the source contact region 12a and the source extension region 12b are set such that these bottoms do not become deeper than the bottom of the well region 20. Impurity concentrations in the source contact region 12a and the source extension region 12b exceed the impurity concentration in the well region 20. The impurity concentrations in the source contact region 12a and the source extension region 12b are set to be from about $1 \times 10^{18}$ to about $1 \times 10^{21}$ cm$^{-3}$ at their maximums, for example.

The implantation mask 100bN between a formation region for the source contact region 12a and a formation region for the source extension region 12b defines a length $L_{N0}$ of the source resistance control region 15a to be formed later. The length $L_{N0}$ is from 0.1 to 10 μm, for example. In terms of suppressing reduction in a channel width density while avoiding excessive increase of a cell pitch of the unit cells 10, an effective range of the length $L_{N0}$ is from 0.1 to 1 μm.

Figure 15:
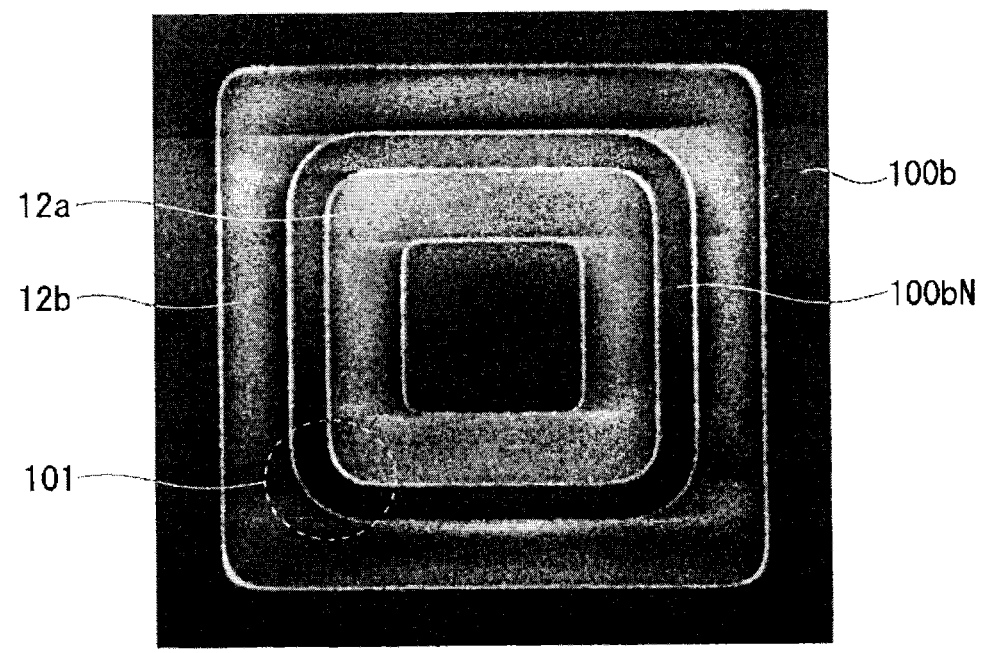
FIG. 15 shows an electron microscope photograph of an implantation mask used for forming a source contact region and a source extension region during a step of manufacturing the semiconductor device of the first embodiment.

FIG. 15 shows an electron microscope photograph of the implantation masks 100b and 100bN used in this step. The source contact region 12a and the source extension region 12b are formed between the implantation masks 100b and 100bN by the selective ion implantation using the implantation masks 100b and 100bN. What are observed in FIG. 15 are that the outer and inner circumferences of the implantation mask 100bN each have a rounded corner area and that the center of a radius of curvature of the outer circumference of the implantation mask 100bN is the same as that of the inner circumference of the implantation mask 100bN. Forming the implantation mask 100bN in this shape forms each corner area of the outer circumference of the source contact region 12a (the inner circumference of the source resistance control region 15a) and each corner area of the inner circumference of the source extension region 12b (the outer circumference of the source resistance control region 15a) into a cornered shape. Further, the center of the radius of curvature of the outer circumference of the source contact region 12a becomes the same as that of the inner circumference of the source extension region 12b. As a result, the length $L_{N0}$ can be uniform within the unit cell 10. In the example of FIG. 15, the length $L_N$ is 0.7 μm.

Making the MOSFET finer to reduce the respective lengths of the source extension region 12b and the source contact region 12a and the length $L_{N0}$ to about 1 μm or less may make it difficult to form the implantation masks 100b and 100bN into their shapes such as those shown in FIG. 10. This is for the reason that the thickness of a mask should be ensured sufficiently in order for the mask to fulfill its function, so that the aspect ratio of a mask pattern is increased further. The implantation mask 100bN to be formed on a formation region for the source resistance control region 15a is particularly hard to form as a result of its high aspect ratio.

Figure 11:
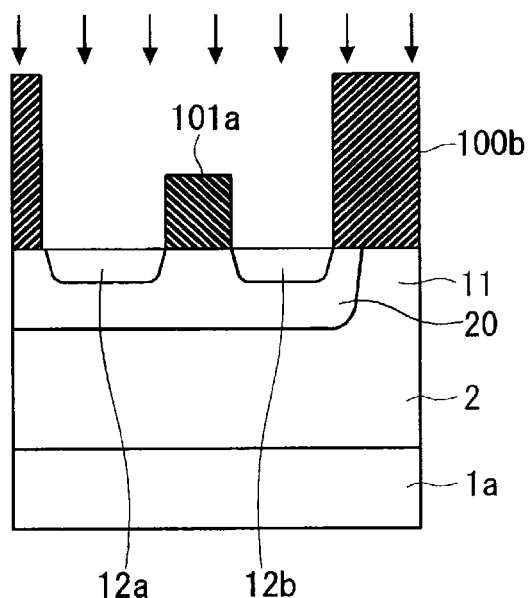
FIG. 11 is a vertical sectional view showing the method of manufacturing the semiconductor device of the first embodiment.

In this case, as shown in FIG. 11, an implantation mask 101a made for example of a silicon oxide film, polycrystalline silicon or the like may be formed on the formation region for the source resistance control region 15a using a dedicated resist for formation of a micropattern, for example, and then the implantation mask 100b may be patterned that can have a mask pattern of a relatively low aspect ratio. Using a complex mask formed of the implantation masks 100b and 101a can easily reduce the respective lengths of the source extension region 12b, the source contact region 12a, and the source resistance control region 15a.

Figure 12:
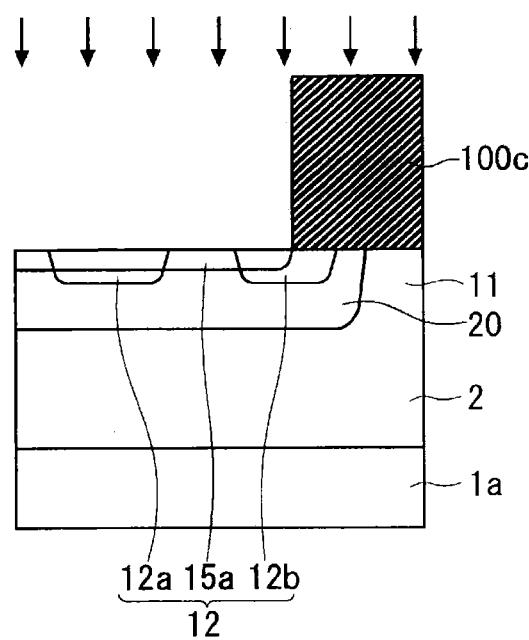
FIG. 12 is a vertical sectional view showing the method of manufacturing the semiconductor device of the first embodiment.

Next, as shown in FIG. 12, selective ion implantation is performed using an implantation mask 100c (such as a resist) processed by photolithography to form the source resistance control region 15a of the first conductivity type. The impurity concentration of the first conductivity type in the source resistance control region 15a exceeds the impurity concentration of the second conductivity type in the extreme surface of the well region 20 and is set for example in a range from $1 \times 10^{15}$ to $1 \times 10^{18}$ cm$^{-3}$, more preferably, in a range from $1 \times 10^{15}$ to $1 \times 10^{17}$ cm$^{-3}$.

The source resistance control region 15a is set to be lower in impurity concentration of the first conductivity type than the source contact region 12a and the source extension region 12b. As an example, the impurity concentration of the first conductivity type in the source resistance control region 15a is set to differ from those in the source contact region 12a and the source extension region 12b by about ten times to about 1000 times. In this case, the sheet resistance of the source resistance control region 15a is also set to differ from those of the source contact region 12a and the source extension region 12b by about ten to about 1000 times.

In the present invention, inserting the source resistance control region 15a of the low impurity concentration of the first conductivity type in the source region 12 controls the resistance of the source region 12 to intentionally increase this resistance. This particularly achieves modulation effect comparable to the ON resistance of the MOSFET or more. Meanwhile, with the intention of reducing the parasitic resistance of the MOSFET and reducing the contact resistance with the ohmic electrode 40, the impurity concentrations of the first conductivity type in the source contact region 12a and the source extension region 12b are increased to reduce their sheet resistances.

In order to obtain the source resistance control region 15a of a large sheet resistance, the impurity concentration of the first conductivity type in the source resistance control region 15a may be set to be from about ¹⁄₁₀₀₀ to about ¹⁄₁₀ of the impurity concentrations of the first conductivity type in the source contact region 12a and the source extension region 12b as described above. The thickness of the source resistance control region 15a in the direction of a substrate depth may be smaller than the respective thicknesses of the source contact region 12a and the source extension region 12b in the direction of the substrate depth.

As described above, the source resistance control region 15a is sufficiently lower in the impurity concentration than the source contact region 12a and the source extension region 12b and thinner than the source contact region 12a and the source extension region 12b. Thus, forming the source resistance control region 15a such that the source resistance control region 15a overlaps the source contact region 12a and the source extension region 12b as shown in FIG. 12 does not largely affect the respective impurity concentrations of the first conductivity type in the source extension region 12b and the source contact region 12a. Thus, in the step view of FIG. 13 and those of subsequent drawings, the source resistance control region 15a is shown to exist only between the source extension region 12b and the source contact region 12a. In a strict sense, after the source resistance control region 15a is formed, the source contact region 12a and the source extension region 12b are each provided with a partial region of an increased impurity concentration of the first conductivity type (region overlapping the source resistance control region 15a).

As shown in FIG. 12, the formation region for the source resistance control region 15a may be formed such that the source resistance control region 15a overlaps the source contact region 12a entirely and overlaps the source extension region 12b partially. In this case, a range of fine processing can be smaller to be performed on the implantation mask 100c to be used for forming the source resistance control region 15a. Alternatively, the source resistance control region 15a may certainly be formed using an implantation mask having an opening only over a place between the source contact region 12a and the source extension region 12b.

Next, for favorable connection between the well region 20 and the source pad 41, the well contact region 25 higher in impurity concentration of the second conductivity type than the well region 20 is formed by selective ion implantation. It is desirable that this ion implantation be performed in a substrate temperature of 150° C. or more. This can form the well contact region 25 of a high sheet resistance. The well contact region 25 is formed so as to have a bottom reaching the well region 20 of the second conductivity type.

The terminal low-resistance region 28 of the second conductivity type is formed in the terminal well region 21 in the terminal region (not shown in FIG. 12) simultaneously with formation of the terminal well region 21. The terminal low-resistance region 28 is capable of reducing the parasitic resistance of the well contact region 25. This can form the structure of a terminal region achieving an excellent dV/dt tolerance, for example. Alternatively, the terminal low-resistance region 28 may certainly be formed in a step different from the step of forming the well contact region 25.

Then, thermal process is performed to electrically activate the impurities implanted in the drift layer 2. This thermal process may be performed in a temperature from 1500° C. to 2200° C. for a period from 0.5 to 60 minutes in an atmosphere of an inert gas such as argon or nitrogen or in a vacuum. This thermal process may be performed while a surface of the drift layer 2 is covered with a film made of carbon, or while the surface of the drift layer 2, the back surface of the semiconductor substrate 1a, and each end surface of the semiconductor substrate 1a and each end surface of the drift layer 2 are covered with a film made of carbon. This can inhibit roughing of the surface of the drift layer 2 to occur by etching resulting from reaction with residual moisture or residual oxygen in the device during the thermal process.

Next, a silicon oxide film (sacrificial oxide film) is formed by thermal oxidation on the surface of the drift layer 2. This oxide film is removed with hydrofluoric acid to remove an affected layer on the surface, thereby obtaining a clean surface. Then, a silicon oxide film is formed for example by CVD (chemical vapor deposition) on the drift layer 2 and is patterned to have an opening over the active region 7, thereby forming the field oxide film 31 in a region outside the active region 7. The field oxide film 31 may have a thickness from 0.5 to 2 μm.

Next, the gate insulating film 30 formed of a silicon oxide film is formed on the surface of the drift layer 2. The gate insulating film 30 may be formed for example by thermal oxidation or deposition. After the silicon oxide film is formed by thermal oxidation or deposition, thermal process may be performed in an atmosphere of an nitride oxide gas (such as NO or N2O), an ammonia atmosphere, or an atmosphere of an inert gas (such as argon).

Figure 13:
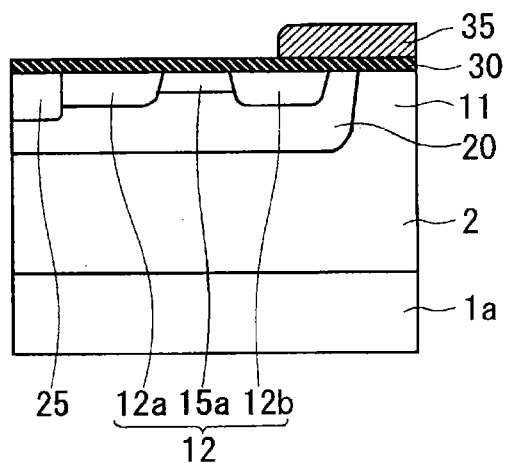
FIG. 13 is a vertical sectional view showing the method of manufacturing the semiconductor device of the first embodiment.

Then, polycrystalline silicon or polycrystalline silicon carbide is deposited by CVD on the gate insulating film 30 and is patterned by photolithography and etching, thereby forming the gate electrode 35. As a result, a structure shown in FIG. 13 is obtained.

It is desirable that polycrystalline silicon or polycrystalline silicon carbide used to form the gate electrode 35 contain phosphorus, boron or aluminum and have a low sheet resistance of the n-type or the p-type. Phosphorus, boron or aluminum may be taken in polycrystalline silicon or polycrystalline silicon carbide while a film of polycrystalline silicon or polycrystalline silicon carbide is deposited. Alternatively, after this film is deposited, phosphorus, boron or aluminum may be ion implanted and activated by thermal process. The material for the gate electrode 35 may be metal or an intermetallic compound. Alternatively, the gate electrode 35 may be a multilayer film containing the metal and the intermetallic compound.

Next, the interlayer insulating film 32 is formed for example by CVD over the drift layer 2. Then, a contact hole (source contact hole) to connect the source pad 41 to each of the source contact region 12a, the well contact region 25, and the terminal low-resistance region 28 is formed for example by dry etching in the interlayer insulating film 32. A contact hole (gate contact hole) to connect the gate interconnect 44 to the gate electrode 35 may also be formed simultaneously. This simplifies a process step to reduce manufacturing cost.

Next, the ohmic electrode 40 is formed on the surface of the drift layer 2 exposed at the bottom of the source contact hole. The ohmic electrode 40 achieves ohmic contact with the source contact region 12a, the well contact region 25, and the terminal low-resistance region 28. According to an exemplary method of forming the ohmic electrode 40, a metal film mainly containing Ni is deposited on the entire surface of the drift layer 2 including the inside of the source contact. The metal film is reacted with silicon carbide by thermal process from 600° C. to 1100° C. to form a silicide film to become the ohmic electrode 40. Then, the metal film remaining unreacted on the interlayer insulating film 32 is removed by wet etching using nitric acid, sulfuric acid, hydrochloric acid, or a liquid containing a mixture of each of these acids and oxygenated water. Thermal process may be performed again after the metal film remaining on the interlayer insulating film 32 is removed. An ohmic contact of a lower contact resistance is formed by performing this thermal process in a higher temperature than the previous thermal process.

If a gate contact hole is formed in the previous step, an ohmic electrode made of silicide is also formed at the bottom of the gate contact hole. If a gate contact hole is not formed in the previous step, the gate contact hole to be filled with the gate interconnect 44 later is formed subsequently by photolithography and etching.

The ohmic electrode 40 may be formed of the same intermetallic compound entirely or may be formed of a suitable intermetallic compound differing between a part to be connected a p-type region and a part to be connected to an n-type region. The ohmic contact resistance of the ohmic electrode 40 sufficiently lower than that of the source contact region 12a of the first conductivity type is important for reducing the ON resistance of the MOSFET. Meanwhile, it is preferable that the ohmic contact resistance of the ohmic electrode 40 be sufficiently lower than that of the well contact region 25 of the second conductivity type in terms of fixing the well region 20 to the ground potential or enhancing the forward direction characteristics of a body diode to be built in the MOSFET. Both of them can be achieved by forming the part of the ohmic electrode 40 to be connected to a p-type region and the part of the ohmic electrode 40 to be connected to an n-type region separately. These parts can be formed separately by performing patterning of the metal film to form the silicide film in these parts separately by photolithography.

While the ohmic electrode 40 is formed on the drift layer 2, a silicide film to become the ohmic electrode 42 is also formed in the same technique on the back surface of the semiconductor substrate 1. The ohmic electrode 42 forms ohmic contact with the semiconductor substrate 1a to achieve favorable connection between the drain electrode 43 to be formed subsequently and the semiconductor substrate 1a.

Figure 14:
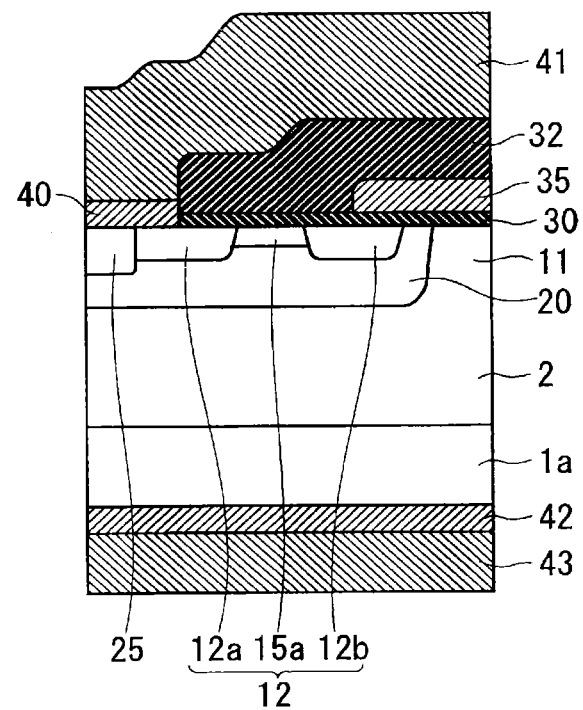
FIG. 14 is a vertical sectional view showing the method of manufacturing the semiconductor device of the first embodiment.

Next, a certain metal film is formed by sputtering or deposition. This metal film is patterned to form the source pad 41, the gate interconnect 44, and the gate pad 45 on the interlayer insulating film 32. Examples of this metal film include films of Al, Ag, Cu, Ti, Ni, Mo, W, Ta and nitrides of these metals, stacked films of these metals, and alloy films of these metals. A metal film of Ti, Ni, Ag or Au is formed on the ohmic electrode 42 on the back surface of the semiconductor substrate 1a to form the drain electrode 43. Then, the MOSFET of the structure shown in FIG. 14 is completed.

Although not shown in the drawings, the resultant MOSFET may be covered with a protective film from above such as a silicon nitride film or polyimide. This protective film has an opening over the gate pad 45 and the source pad 41, so that the gate pad 45 and the source pad 41 can be connected to an external control circuit.

After the protective film is formed, the semiconductor substrate 1a may be thinned to a thickness of about 100 μm by polishing the semiconductor substrate 1a from its back surface. In this case, the polished surface is cleaned after the thinning and a metal film mainly containing Ni is deposited entirely on the back surface. Then, a silicide film is formed on the back surface of the semiconductor substrate 1a by local heating such as laser annealing, thereby forming the ohmic electrode 42. Then, like in the aforementioned step, the drain electrode 43 formed of a metal film of Ti, Ni, Ag or Au is formed on the ohmic electrode 42.

Figure 16:
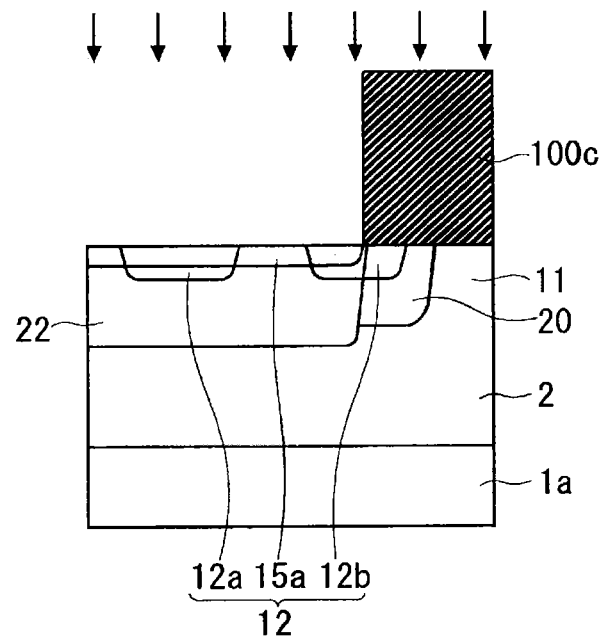
FIG. 16 is a vertical sectional view showing a modification of the method of manufacturing the semiconductor device of the first embodiment.
Figure 17:
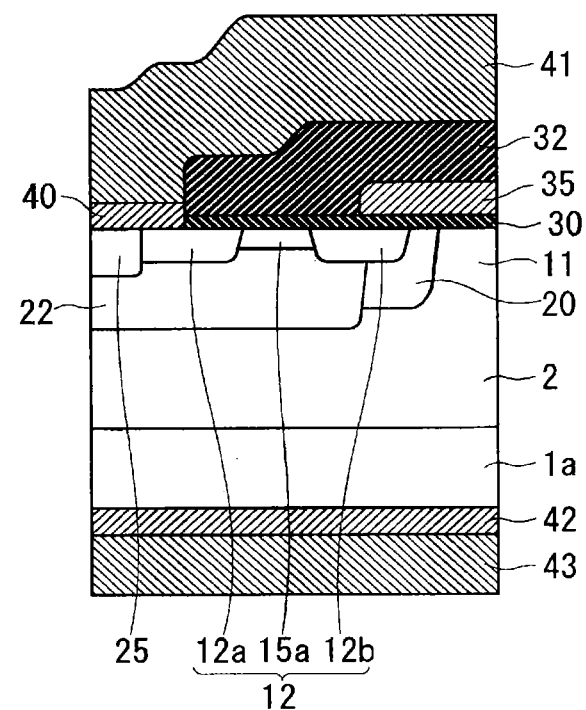
FIG. 17 is a vertical sectional view showing the modification of the method of manufacturing the semiconductor device of the first embodiment.

After the aforementioned ion implantation step (FIG. 12) of forming the source resistance control region 15a, impurities of the second conductivity type may be ion implanted using the implantation mask 1000 used in this step, thereby forming a high impurity concentration well region 22 narrower than the well region 20 as shown in FIG. 16. FIG. 17 shows the structure of a MOSFET including the high impurity concentration well region 22.

The high impurity concentration well region 22 is capable of reducing the sheet resistance of the well region 20 by increasing the impurity concentration of the second conductivity type in the well region 20. This contributes to reduction in switching loss to be caused by delay in charge transport during switching operation of the MOSFET and enhancement of reliability. It is desirable that a distribution of the impurity concentration of the second conductivity type in the high impurity concentration well region 22 be such that the impurity concentration is low in a shallow position in the drift layer 2 and is high in a deep position in the drift layer 2. This distribution can increase the impurity concentration of the second conductivity type in the well region 20 while suppressing influence on an effective impurity concentration in the source resistance control region 15*a* where the impurity concentration of the first conductivity type is low. The high impurity concentration well region 22 may be deeper or shallower than the well region 20 or may be the same in depth as the well region 20.

In this embodiment, the MOSFET is shown as an example of the semiconductor device to which the present invention is applied. The present invention is also applicable to an IGBT including a semiconductor substrate 1*b* of the second conductivity type shown in FIG. 18 instead of the semiconductor substrate 1*a* of the first conductivity type. In this IGBT, the source region 12 becomes an "emitter region," the well region 20 becomes a "base region", and the semiconductor substrate 1*b* becomes a "collector region." An emitter resistance can be increased by providing a high-resistance resistance control region (source resistance control region 15*a*) in the emitter region (source region 12). This makes it possible to reduce a current gain in a parasitic transistor formed of the emitter region (source region 12), the base region (well region 20), and the drift layer 2. This achieves the effect of preventing latch-up to occur in response to operation of a parasitic thyristor of the IGBT.

In the first embodiment, the source resistance control region 15*a* formed in the step different from the step of forming the source contact region 12*a* and the source extension region 12*b* is inserted in series in a path from the channel region in the well region 20 to the ohmic electrode 40 and the source electrode 41. As a result, an effective source resistance can be changed by changing the impurity concentration in the source resistance control region 15*a*.

A drain saturation current to affect the level of a short-circuit tolerance is proportional to the square of a gate-to-source voltage to be applied to a channel. In the presence of a significant source resistance as in the present invention, an effective gate-to-source voltage becomes lower by the product of the source resistance and a drain current. Thus, increasing the source resistance reduces the saturation current, so that the short-circuit tolerance can be increased.

Meanwhile, increasing the source resistance excessively is unfavorable as this leads to increase in conduction loss during rated ON operation. Additionally, if the impurity concentration of the first conductivity type in a source region is substantially uniform in the lateral direction as in a conventional MOSFET, increasing the source resistance increases a contact resistance between the source region and a source pad (ohmic electrode). This leads to greater loss of the element. In the present invention, the ohmic electrode 40 connected to the source pad 41 contacts only the low-resistance source contact region 12*a* and does not contact the high-resistance source resistance control region 15*a*. This maintains a contact resistance low between the ohmic electrode 40 and the source region 12. As a result, the source resistance can be designed so as to reduce a saturation current while ON resistance is prevented from increasing excessively.

The mobility of conduction carriers (electrons or holes) in the source resistance control region 15*a* is known to be affected strongly by lattice scattering to become lower in a higher temperature. Specifically, an electrical resistance becomes higher in a higher temperature. The source resistance control region 15*a* is lower in impurity concentration of the first conductivity type than the source contact region 12*a* and the source extension region 12*b*. Thus, the electrical resistance of the source resistance control region 15*a* increases at a higher rate in a high temperature than those of the source contact region 12*a* and the source extension region 12*b*. The present inventors have confirmed that during the occurrence of a short-circuit of the element, heat (Joule heat) generated due to a high drain current reaches a temperature as high as 1000K immediately before breakdown. The present invention makes what is called negative feedback become functional by which a higher temperature increases the resistance of the source resistance control region 15*a* to reduce an effective gate voltage to be applied to the channel region, thereby reducing a drain current. This can extend a period of time until when a temperature increases to about 1000K, so that a short-circuit tolerance can be enhanced substantially.

In the first embodiment, the source extension region 12*b* has the same distribution of the impurity concentration of the first conductivity type as that of the source contact region 12*a* and has a low sheet resistance. Generally, what is required to reduce a connection resistance with the channel region is to place the gate insulating film 30 and the gate electrode 35 directly above an end portion of the channel region near the source, place this end portion inward of an end portion of the gate electrode 35, and make the end portion of the channel region overlap the gate electrode 35.

A self-aligned process of performing implantation for forming a source region and activation annealing after forming a gate electrode has widely been applied in making a conventional semiconductor device using silicon. This process cannot be applied in making a silicon carbide semiconductor device having a MOS structure. Thus, the source region and the gate electrode are arranged while a sufficient margin for alignment shift is maintained that is to occur during photolithography for patterning each of the source region and the gate electrode. Thus, in the source region, carriers are accumulated in a MOS interface to reduce a resistance in a region overlapping the gate electrode, whereas a sheet resistance itself affects a source resistance in a region not overlapping the gate electrode. If the sheet resistance of the entire source region is increased with the intention of reducing a saturation current, the length of the region not overlapping the gate electrode contributes to the level of the saturation current. Meanwhile, a path length of this region depends the accuracy in the alignment with the gate electrode. This may cause variation in a source resistance in the unit cell 10 (the path length becomes shorter with a larger amount of the overlap to reduce the source resistance and the path length becomes longer with a smaller amount of the overlap to increase the source resistance). This is unfavorable as this leads to imbalance in a saturation current value in the unit cell 10.

In this embodiment, the sheet resistance of the source extension region 12b overlapping the gate electrode 35 is set to be low within an extent that does not affect reduction in an effective gate voltage seriously. The source resistance control region 15a does not overlap the gate electrode 35. The path length of the source resistance control region 15a, specifically a gap between the source contact region 12a and the source extension region 12b is determined by one-time photolithography (FIGS. 10 and 15) and does not depend on alignment accuracy. This can avoid imbalance in a saturation current value in the unit cell 10.

In particular, an element having a MOS structure using silicon carbide is known to cause accelerated oxidation. According to the accelerated oxidation, if a region containing many implanted impurities is subjected to thermal oxidation, for example, this region is oxidized at a higher speed than a region containing no impurities. In the first embodiment, the source extension region 12b of a low sheet resistance, specifically the source extension region 12b containing many implanted impurities forms a MOS structure at an end portion of the gate electrode 35. If the gate insulating film 30 is formed by thermal oxidation, the thickness of the oxidized film can be increased accordingly at this portion. As a result, the intensity of a gate electric field is reduced at the end portion of the gate electrode 35 to form an element of higher reliability. This forms another reason for preventing overlap of the source resistance control region 15a with the gate electrode 35.

The present inventors made a prototype of the semiconductor element of this embodiment and conducted an experiment to evaluate its electrical characteristics. A result of the experiment is given below.

Figures 19, 20:
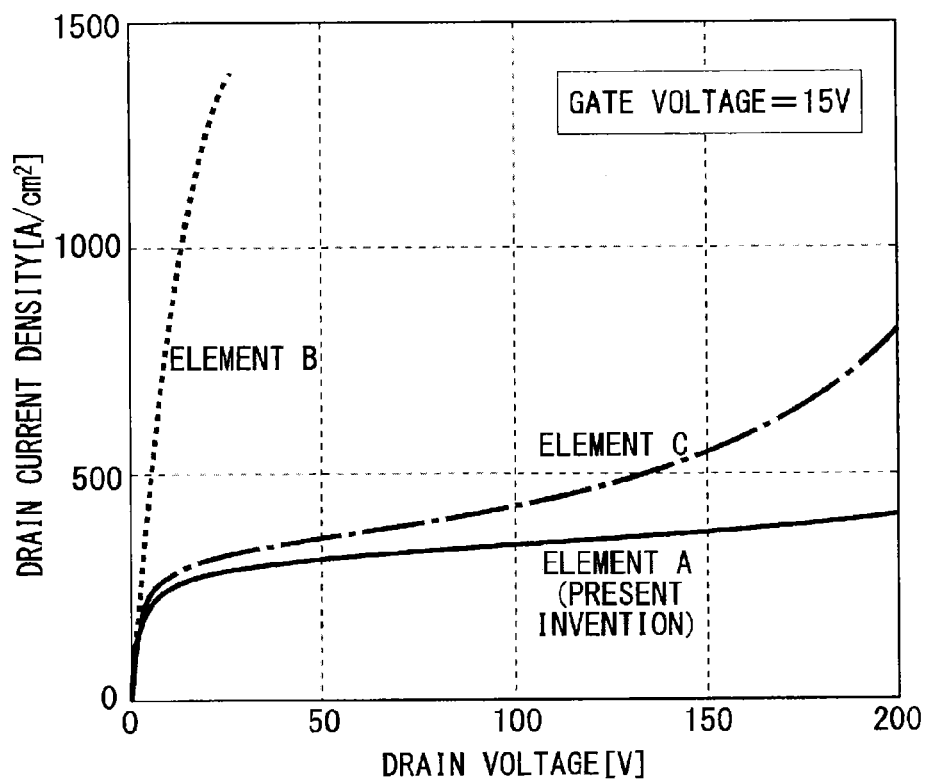
FIG. 19 shows the current-voltage characteristics of the semiconductor device of the first embodiment.
FIG. 20 shows a list of electrical characteristics of the semiconductor device of the first embodiment.

FIG. 19 is a graph showing a relationship between a drain current density and a drain voltage in a silicon carbide MOSFET. In FIG. 19, an "element A" is a silicon carbide MOSFET formed as a prototype of this embodiment, and an "element B" and an "element C" are conventional silicon carbide MOSFETs made as comparison targets. FIG. 20 shows the respective channel lengths, threshold voltages, and ON resistance of the elements A, B and C (ON resistance is a value obtained with a drain current density of 100 A/cm$^2$).

The element A includes the source resistance control region 15a and has a channel length of 0.4 μm, a threshold voltage of 2.5 V, and an ON resistance of 16 mΩcm$^2$. The element B does not include the source resistance control region 15a. The element B has a channel length of 0.4 μm same as that of the element A. The element B has the same channel structure as the element A, so that the threshold voltage of the element B is 2.3 V comparable to that of the element A. The element C does not include the source resistance control region 15a. The element C has a long channel length such that the ON resistance of the element C becomes comparable to that of the element A. More specifically, the channel length of the element C is 0.8 μm and the ON resistance of the element C is 15 mΩcm$^2$.

As shown in FIG. 20, the element A is larger in ON resistance than the element B for the presence of the source resistance control region 15a. Further, the experimental result of FIG. 19 shows that the element A achieves more excellent saturation characteristics of a drain current. A possible reason therefor is as follows. The element B encounters degradation of saturation characteristics due to short-channel effect. In the element A, voltage drop in the source resistance control region 15a reduces an effective gate voltage, thereby inhibiting degradation of the saturation characteristics due to short-channel effect.

The ON resistance of the element C is comparable to that of the element A. Meanwhile, the experimental result of FIG. 19 shows that the element A achieves more excellent saturation characteristics of a drain current than the element C. A MOSFET achieves the effect of enhancing the MOS channel characteristics of a MOS (increasing channel mobility) as a result of heat generated during application of a high bias. In the element C, this effect increases a drain current during application of the high bias. In the element A, voltage drop in the source resistance control region 15a reduces an effective gate voltage to cancel this effect to suppress increase in a drain current. This is considered to be the reason why the element A achieves more excellent saturation characteristics than the element C.

As described above, a semiconductor element including the source resistance control region 15a was confirmed to achieve excellent saturation characteristics. This means enhancement of a short-circuit tolerance that results from one of the effects of the present invention.

As described above, in the semiconductor device of the first embodiment, the source region 12 has a structure where the source contact region 12a contacting the ohmic electrode 40 connected to the source pad 41, the source extension region 12b adjacent to the channel region, and the source resistance control region 15a between the source contact region 12a and the source extension region 12b are connected in series. As a result, a saturation current can be controlled with a source resistance responsive to the sheet resistance of the source resistance control region 15a.

The source extension region 12b and the source contact region 12a are formed simultaneously and have the same distribution of an effective impurity concentration of the first conductivity type. This can reduce process workload to reduce manufacturing cost, make formation of a fine patterning unnecessary to enhance ease of manufacture, and control the length of the source resistance control region 15a easily placed between the source extension region 12b and the source contact region 12a.

The distribution of the impurity concentration of the first conductivity type in the source resistance control region 15a is uniform in a direction from the source extension region 12b toward the source contact region 12a. Thus, a design value of a source resistance achieved in the source resistance control region 15a can be controlled with higher performance to enhance robustness during manufacture.

The distance of the source resistance control region 15a in the direction from the source extension region 12b toward the source contact region 12a is uniform in the unit cell 10. Thus, a current distribution and a distribution of heat generated during the occurrence of a load short-circuit become uniform in the unit cell 10, thereby enhancing reliability to withstand element breakdown that involves heat generation during the occurrence of a load short-circuit, for example.

The impurity concentration of the first conductivity type in the source resistance control region 15a is made smaller than that in the source extension region 12b or the source contact region 12a by an order of magnitude or more (¹⁄₁₀ or less) to increase the sheet resistance of the source resistance control region 15a. As a result, the ON resistance of the semiconductor device can be given a significant source resistance, thereby achieving the effect of reducing a saturation current and increasing a short-circuit tolerance. The depth of the impurity concentration of the first conductivity type in the source resistance control region 15a may be made smaller than that in the source extension region 12b or the source contact region 12a. This also increases the sheet resistance of the source resistance control region 15a. Thus, the ON resistance of the semiconductor device can be given a significant source resistance, thereby achieving the same effect.

Second Embodiment

In the first embodiment, ion implantation to form the source contact region 12a and the source extension region 12b and ion implantation to form the source resistance control region 15a are performed in different steps. A second embodiment suggests a technique of performing these ion implantations in one step.

Figure 21:
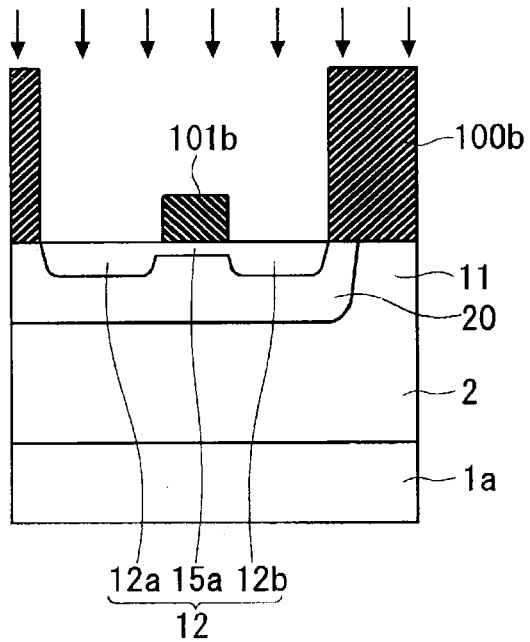
FIG. 21 is a vertical sectional view showing a method of manufacturing a semiconductor device of a second embodiment.

FIG. 21 shows a method of manufacturing a silicon carbide MOSFET as a semiconductor device of the second embodiment. In this embodiment, as shown in FIG. 21, the implantation mask 101a formed on the formation region for the source resistance control region 15a in the step described in the first embodiment using FIG. 11 is replaced by a thin implantation mask 101b. The thickness of the implantation mask 101b is determined such that some of impurities of the first conductivity type to be ion implanted for forming the source contact region 12a and the source extension region 12b penetrate the implantation mask 101b.

In this case, during the ion implantation for forming the source contact region 12a and the source extension region 12b, the source resistance control region 15a of a low impurity concentration and of a small thickness can be formed with the impurities having penetrated the implantation mask 101b. Specifically, the source contact region 12a, the source extension region 12b, and the source resistance control region 15a can be formed simultaneously.

Figure 22:
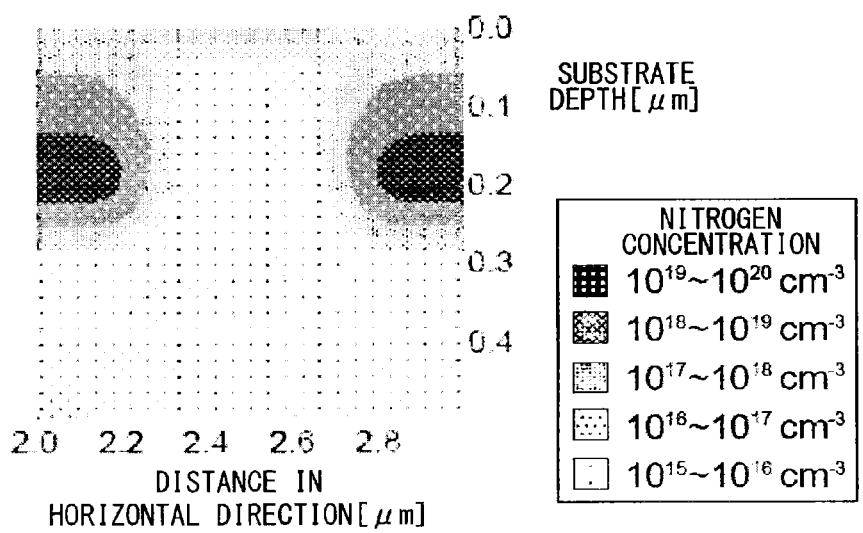
FIG. 22 shows a result of numerical calculation of a distribution of the impurity concentration of a first conductivity type in a source region of the semiconductor device of the second embodiment.

FIG. 22 shows a result of numerical calculation of a distribution of the impurity concentration of the first conductivity type in the source region 12 formed in silicon carbide semiconductor by the aforementioned method. This numerical calculation was conducted based on the assumption that a silicon oxide film was used as the implantation mask 101b, the thickness of the implantation mask 101b was 450 nm, and nitrogen was implanted at 110 keV. In a region not covered with the implantation mask 101b, a region corresponding to the source extension region 12b and a region corresponding to the source contact region 12a are formed each having the maximum nitrogen concentration of $1\times10^{19}$ cm$^{-3}$ or more at a depth of about 0.30 µm. It is also seen that in a region below the implantation mask 101b, a region corresponding to the source resistance control region 15a is formed that has a nitrogen concentration from about $1\times10^{16}$ to about $1\times10^{18}$ cm$^{-3}$ at a depth of about 0.05 µm.

In this embodiment, a step of forming the source resistance control region 15a individually can be omitted, thereby simplifying manufacturing steps.

Figure 23:
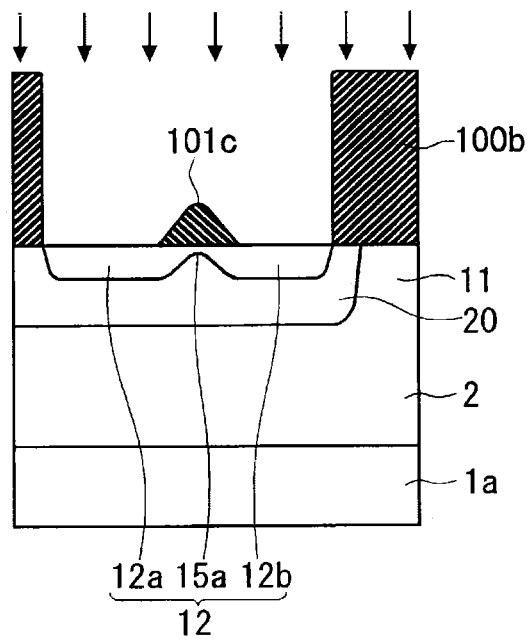
FIG. 23 is a vertical sectional view showing the method of manufacturing the semiconductor device of the second embodiment.

As shown in FIG. 23, the implantation mask 101b of high rectangularity shown in FIG. 21 may be replaced by a tapered implantation mask 101c having tilted side walls. In this case, the source resistance control region 15a is formed with impurities having penetrated the tilted surfaces of the implantation mask 101c during ion implantation for forming the source contact region 12a and the source extension region 12b. Thus, according to a distribution of an impurity concentration in the resultant source resistance control region 15a, the impurity concentration is not constant in the lateral direction but it decreases continuously toward a central part. The thickness of the implantation mask 101c and a condition for implantation of impurities are determined such that the central part of the resultant source resistance control region 15a exhibits an effective first conductivity type. This distribution of the impurity concentration in the source resistance control region 15a can also be obtained by implanting ions from a direction oblique to the surface of the drift layer 2 and rotating the direction while using the implantation mask 101b of high rectangularity shown in FIG. 21.

Figure 24:
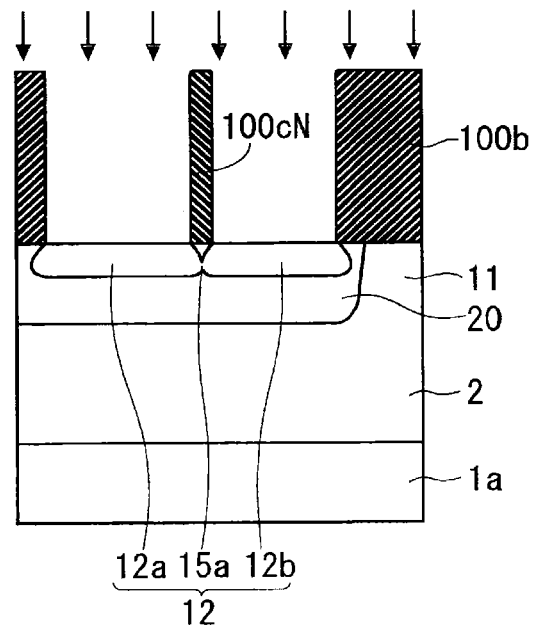
FIG. 24 is a vertical sectional view showing the method of manufacturing the semiconductor device of the second embodiment.

As shown in FIG. 24, regarding an implantation mask 100c and an implantation mask 100cN used for forming the source contact region 12a and the source extension region 12b, the implantation mask 100cN formed on the formation region for the source resistance control region 15a may be narrowed. The width of the implantation mask 100cN is set to be smaller than the sum of spread of impurities in the lateral direction implanted during ion implantation for forming the source contact region 12a and spread of the impurities in the lateral direction implanted during ion implantation for forming the source extension region 12b. The width of the implantation mask 100cN is set to be about 0.2 µm, for example. If it is difficult to form the implantation mask 100cN into a substantially small width, the implantation mask 100c or 100cN of a relatively large width may be formed. Then, this may implantation mask may be reduced in width by process such as trimming.

The source contact region 12a and the source extension region 12b are formed by ion implantation using the implantation masks 100c and 100cN, implanted impurities scatter in the lateral direction to make the source contact region 12a and the source extension region 12b contact each other in a deep place in the drift layer 2. This place becomes the source resistance control region 15a of a low impurity concentration of the first conductivity type. Specifically, the source contact region 12a, the source extension region 12b, and the source resistance control region 15a can be formed simultaneously.

Figure 25:
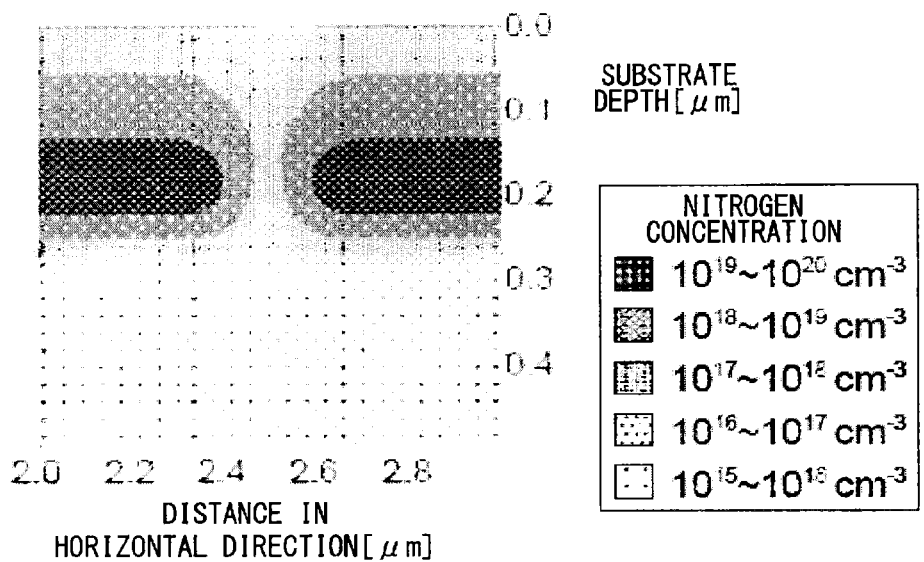
FIG. 25 shows a result of numerical calculation of a distribution of the impurity concentration of the first conductivity type in the source region of the semiconductor device of the second embodiment.
Figure 26:
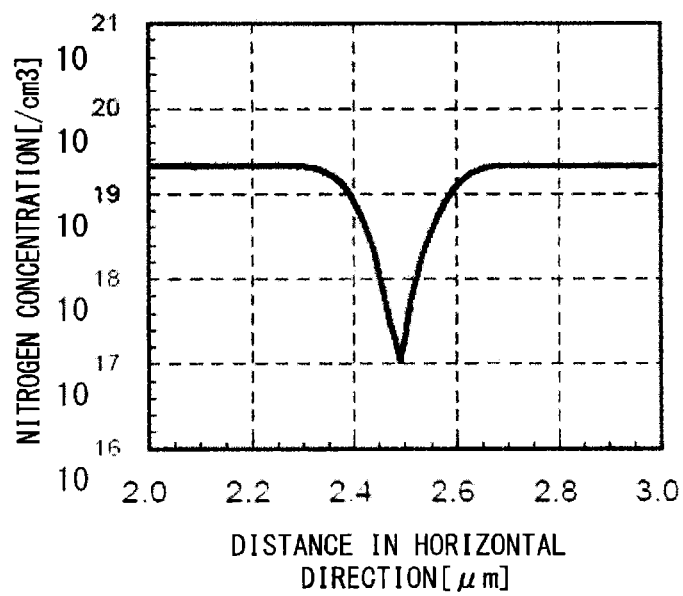
FIG. 26 shows a result of numerical calculation of the distribution of the impurity concentration of the first conductivity type in the source region of the semiconductor device of the second embodiment.

FIG. 25 shows a result of numerical calculation of a distribution of the impurity concentration of the first conductivity type in the source region 12 formed in silicon carbide semiconductor by the aforementioned method. This numerical calculation was conducted based on the assumption that the width of an implantation mask used was 0.2 µm and nitrogen was implanted at 110 keV. FIG. 26 shows a distribution of a nitrogen concentration in the lateral direction obtained at the same time at a depth of 0.19 µm. A nitrogen concentration is about $2\times10^{19}$ cm$^{-3}$ in a region corresponding to the source contact region 12a and a region corresponding to the source extension region 12b. Meanwhile, in a region defined between these regions and corresponding to the source resistance control region 15a, a nitrogen concentration becomes lower with a minimum value of about $1\times10^{17}$ cm$^{-3}$.

This technique can also omit the step of forming the source resistance control region 15a individually, thereby achieving the effect of simplifying manufacturing steps. In particular, impurities in silicon carbide have a thermal diffusion coefficient considerably smaller than that of impurities in silicon conventionally used for power devices. Thus, even thermal diffusion caused by high temperature thermal process such as activation annealing generates substantially no redistribution of implanted impurities, so that a distribution determined at the time of implantation is maintained substantially as it is. As a result, a steep distribution of impurities such as that shown in FIGS. 25 and 26 can be obtained as a final shape of the element.

The following describes a different technique of forming the source region 12 in one ion implantation step including the source contact region 12a, the source extension region 12b, and the source resistance control region 15a.

Figure 27:
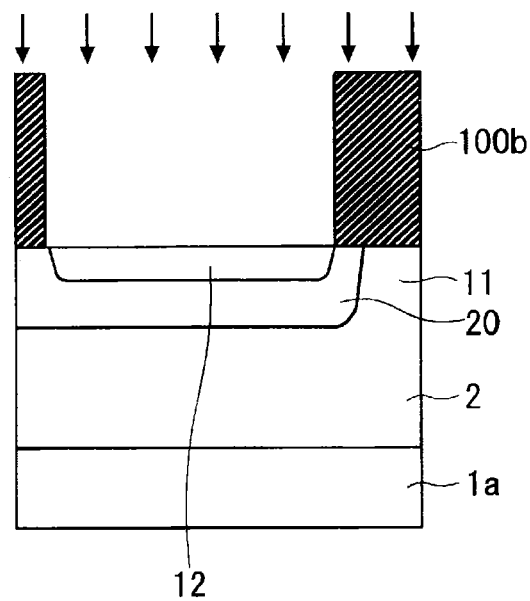
FIG. 27 is a vertical sectional view showing the method of manufacturing the semiconductor device of the second embodiment.
Figure 28:
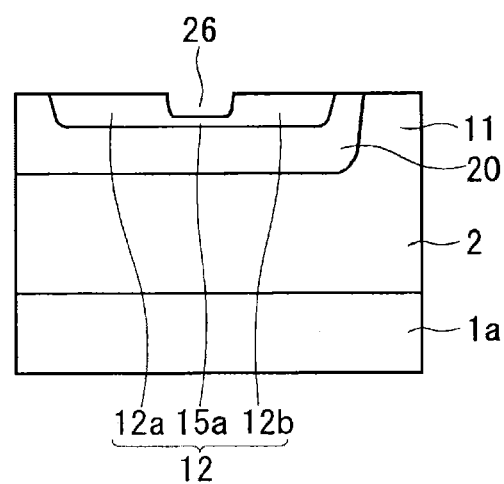
FIG. 28 is a vertical sectional view showing the method of manufacturing the semiconductor device of the second embodiment.

In the step described in the first embodiment using FIG. 10, the implantation mask 100bN is not formed on the formation region for the source resistance control region 15a, so that only the implantation mask 100b is formed as shown in FIG. 27. Then, impurities of the first conductivity type are ion implanted to form the source region 12. Next, selective etching using a resist mask and the like is performed to form a recess 26 in an upper part of the formation region for the source resistance control region 15a to thin the source region 12 in this part as shown in FIG. 28. Specifically, the recess 26 is formed to be shallower than the depth of the source region 12 to make a region of the first conductivity type remain below a bottom part of the recess 26.

The part of the source region 12 thinned by the etching (the region of the first conductivity type below the bottom part of the recess 26) becomes high in resistance, so that this part is to function as the source resistance control region 15a. Parts of the source region 12 on the opposite sides not having been etched are maintained at a low resistance, so that these parts are to function as the source contact region 12a and the source extension region 12b.

Thus, in this technique, the source region 12 including the source contact region 12a, the source extension region 12b, and the source resistance control region 15a can be formed only in one ion implantation step. In this technique, the width or the depth of the recess 26 can be used to control the resistance value of the source resistance control region 15a.

Third Embodiment

A third embodiment suggests a technique of forming an implantation mask used for forming the source contact region 12a and the source extension region 12b and an implantation mask used for forming the well region 20 by using only one-time photolithography.

In the third embodiment, after the source extension region 12b and the source contact region 12a are formed, an implantation mask having been used for forming the source extension region 12b and the source contact region 12a is trimmed to process a mask used for forming the well region 20. Thus, in this embodiment, the well region 20 is formed after the source contact region 12a and the source extension region 12b are formed.

Figure 29:
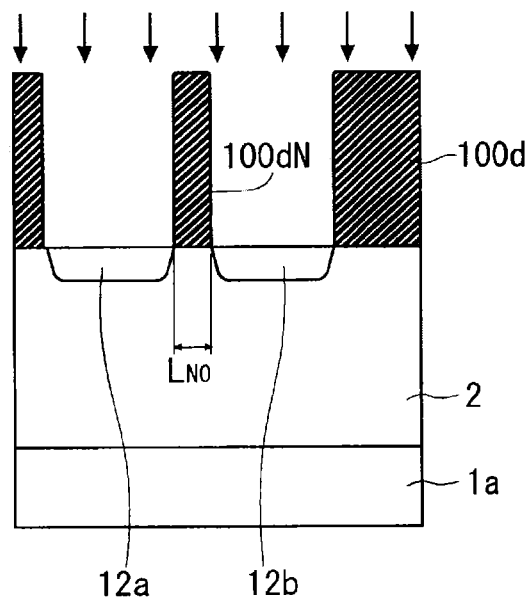
FIG. 29 is a vertical sectional view showing a method of manufacturing a semiconductor device of a third embodiment.
Figure 30:
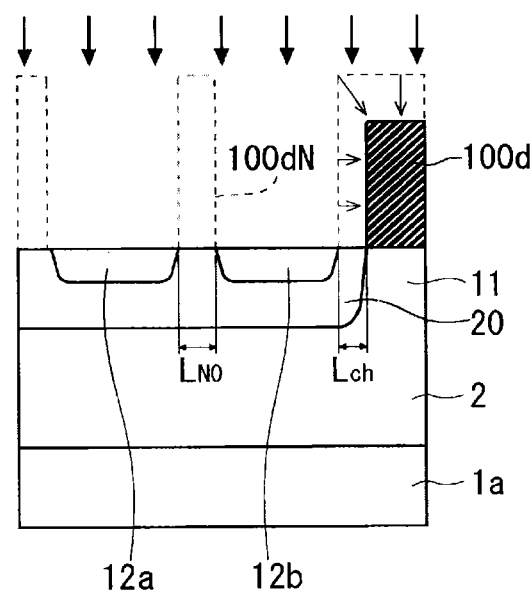
FIG. 30 is a vertical sectional view showing the method of manufacturing the semiconductor device of the third embodiment.

FIGS. 29 and 30 show the steps of this embodiment for forming the well region 20, the source contact region 12a, and the source extension region 12b. Before the formation of the well region 20, an implantation mask 100d and an implantation mask 100dN are formed that have openings over the respective formation regions for the source contact region 12a and the source extension region 12b as shown in FIG. 29. Then, impurities of the first conductivity type are implanted to form the source extension region 12b and the source contact region 12a. At this time, the implantation mask 100dN formed on the formation region for the source resistance control region 15a has a width $L_{N0}$ that is twice a length Lch (channel length) of a channel region in the well region 20 to be formed later or less.

Then, as shown in FIG. 30, the implantation masks 100d and 100dN are trimmed by etching. This trimming is performed by oxygen plasma process if the implantation mask 100dN is a resist. If the implantation mask 100dN is a silicon oxide film, this trimming is performed by dry etching using CHF3 gas or the like or wet etching with hydrofluoric acid or buffered hydrofluoric acid. An amount to be etched during the trimming is set to be substantially the same as the length Lch of the channel region in the well region 20 to be formed later. The width $L_{N0}$ of the implantation mask 100dN is twice the length Lch of the channel region or less, so that the implantation mask 100dN is removed completely by the trimming.

As shown in FIG. 30, impurities of the second conductivity type are thereafter ion implanted using the trimmed implantation mask 100d, thereby forming the well region 20. The channel region in the well region 20 has the length Lch that is determined in a self-aligned manner to become substantially the same as the trimmed amount. The implantation mask 100dN on the formation region for the source resistance control region 15a is removed. As a result, the well region 20 is also formed uniformly below this formation region. Then, the step of FIG. 12 and subsequent steps described in the first embodiment are performed to obtain the MOSFET structure shown in FIG. 14.

In the third embodiment, the well region 20 can also be formed uniformly below the source resistance control region 15a and the channel region of a uniform length can be formed in a self-aligned manner. This makes an ON current distribution and a threshold voltage uniform in the unit cell 10, so that a highly-reliable semiconductor device can be obtained.

Fourth Embodiment

In a fourth embodiment, the present invention is applied to a trench-type MOSFET. FIGS. 31 to 39 are views of steps showing a method of manufacturing a trench-type silicon carbide MOSFET as a semiconductor device of this embodiment. FIGS. 31 to 39 correspond to vertical sections of the right half of one of the multiple unit cells 10 arranged in the active region 7. Specifically, FIGS. 31 to 39 do not include the terminal region and show a cross section at an arbitrary position in a region inside the active region 7.

The method of manufacturing the silicon carbide MOSFET of the fourth embodiment is described below.

First, like in the first embodiment, the drift layer 2 is formed on the semiconductor substrate 1a. Then, procedure with the same steps as those described by using FIGS. 9 to 12 is followed to implant ions into the drift layer 2, thereby forming the source region 12 including the source contact region 12a, the source extension region 12b, and the source resistance control region 15a. Next, ions are implanted selectively to form the well contact region 25.

The well region 20 and the source extension region 12b may be continuous with the well region 20 and the source extension region 12b in an adjacent unit cell 10 (specifically, the JFET region 11 can be omitted). The source resistance control region 15a is sufficiently lower in impurity concentration than the source extension region 12b and has substantially no influence on the impurity concentration in the source extension region 12b. Thus, the source resistance control regions 15a may also be formed to be continuous with each other over the unit cells 10. Specifically, the implantation mask 100a of FIG. 9, the implantation mask 100b on the right side of FIG. 10 (or FIG. 11), and the implantation mask 100c of FIG. 12 can be omitted. A structure obtained in this case is shown in FIG. 31.

Figure 31:
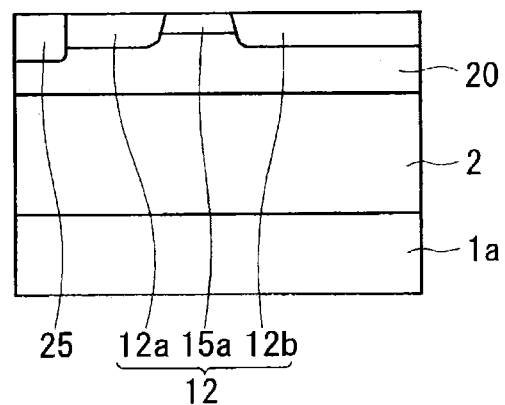
FIG. 31 is a vertical sectional view showing a method of manufacturing a semiconductor device of a fourth embodiment.
Figure 32:
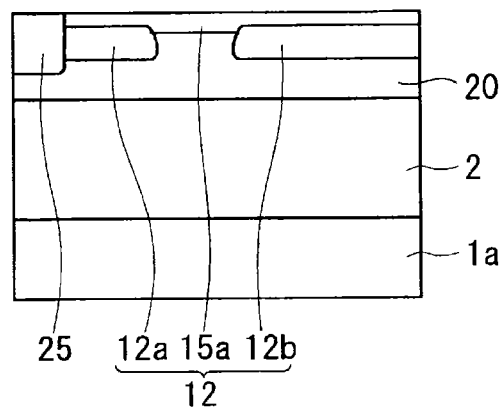
FIG. 32 is a vertical sectional view showing the method of manufacturing the semiconductor device of the fourth embodiment.

The source contact region 12a and the source extension region 12b may contact a surface of the drift layer 2 as shown in FIG. 31 or may be separated from the surface of the drift layer 2 as shown in FIG. 32. In the example of FIG. 32, the source contact region 12a and the source extension region 12b are formed so as to be buried inside the drift layer 2. The source resistance control region 15a is formed in an upper layer area of the drift layer 2 (surface area of the drift layer 2) so as to contact the source contact region 12a and the source extension region 12b.

Figure 33:
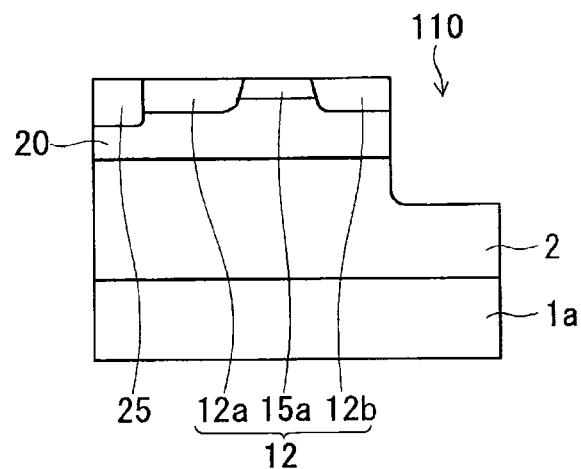
FIG. 33 is a vertical sectional view showing the method of manufacturing the semiconductor device of the fourth embodiment.

Next, a trench 110 such as that shown in FIG. 33 is formed by selective etching in a region between the unit cells 10. The trench 110 is formed to contact the well region 20 and the source extension region 12b and to be deeper than the bottom of the well region 20. The source extension region 12b and the well region 20 are exposed at a side wall of the trench 110 side by side in the vertical direction (direction vertical to the surface of the drift layer 2, specifically the depth direction of the trench 110).

It is desirable that a corner area of the trench 110 be formed into a tapered or round shape with the intention of reducing electric field concentration to occur while the MOSFET operates. It is also desirable that the side wall of the trench 110 be nearly vertical to the surface of the drift layer 2.

Next, a side wall surface of the trench 110 is cleaned by sacrificial oxidation or CDE (chemical dry etching). Then, the field oxide film 31, the gate insulating film 30, and the gate electrode 35 are formed by the same technique as that of the first embodiment.

Figure 34:
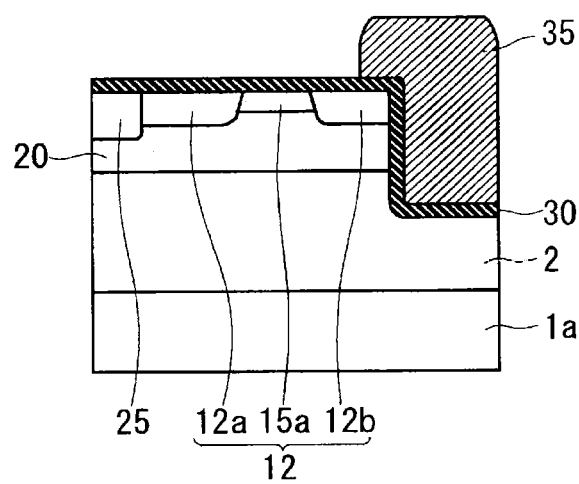
FIG. 34 is a vertical sectional view showing the method of manufacturing the semiconductor device of the fourth embodiment.

As shown in FIG. 34, the gate insulating film 30 is formed on the surface of the drift layer 2 including the inside of the trench 110. The gate electrode 35 is buried at least partially in the trench 110. The gate electrode 35 is arranged so as to be adjacent through the gate insulating film 30 to the source extension region 12b, the well region 20, and the drift layer 2 exposed at the side wall of the trench 110. Specifically, the gate electrode 35 extends over the source extension region 12b, the well region 20, and the drift layer 2 exposed at the side wall of the trench 110. In this case, a part of the well region 20 defined between the drift layer 2 under the well region 20 and the source extension region 12b and adjacent to the trench 110 is to become a channel region of the MOSFET.

Figure 35:
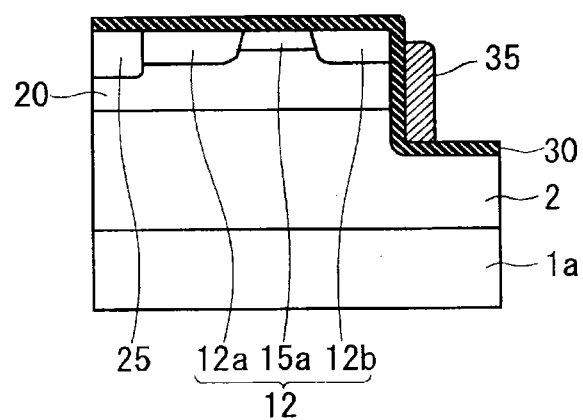
FIG. 35 is a vertical sectional view showing the method of manufacturing the semiconductor device of the fourth embodiment.

During patterning of the gate electrode 35, placing an end portion of the gate electrode 35 in the lateral direction outside the trench 110 results in the structure of FIG. 34 where the gate electrode 35 is partially buried in the trench 110. Alternatively, as shown in FIG. 35, the gate electrode 35 may remain only inside the trench 110 (side wall area), so that the gate electrode 35 may be buried entirely in the trench 110.

After the gate electrode 35 is formed, same procedure as that of the first embodiment is followed to form the interlayer insulating film 32, the ohmic electrode 40, and the source pad 41. As a result, the trench-type silicon carbide MOSFET is obtained having the structure shown in FIG. 36.

Figure 37:
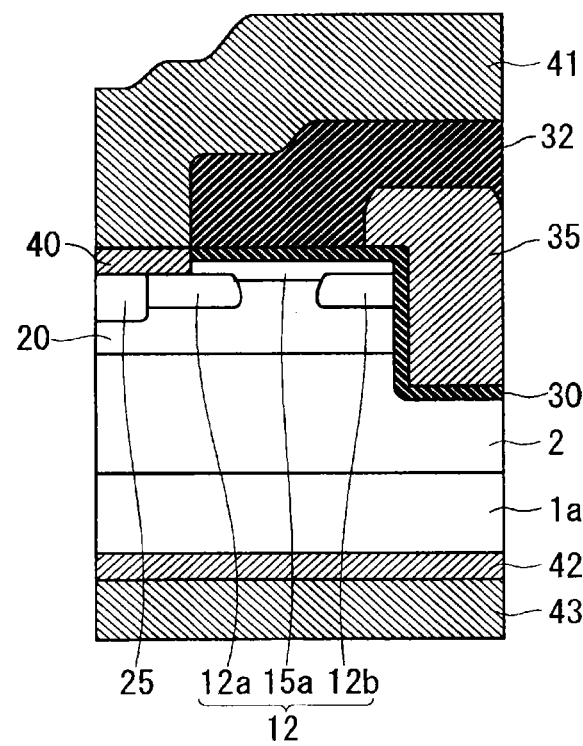
FIG. 37 is a vertical sectional view showing the method of manufacturing the semiconductor device of the fourth embodiment.

Forming the source region 12 into the structure of FIG. 32 provides the silicon carbide MOSFET with the structure of FIG. 37. Forming the gate electrode 35 into the shape of FIG. 35 provides the silicon carbide MOSFET with the structure of FIG. 38. Further, forming the source region 12 into the structure of FIG. 32 and forming the gate electrode 35 into the shape of FIG. 35 provides the silicon carbide MOSFET with the structure of FIG. 39.

Figure 36:
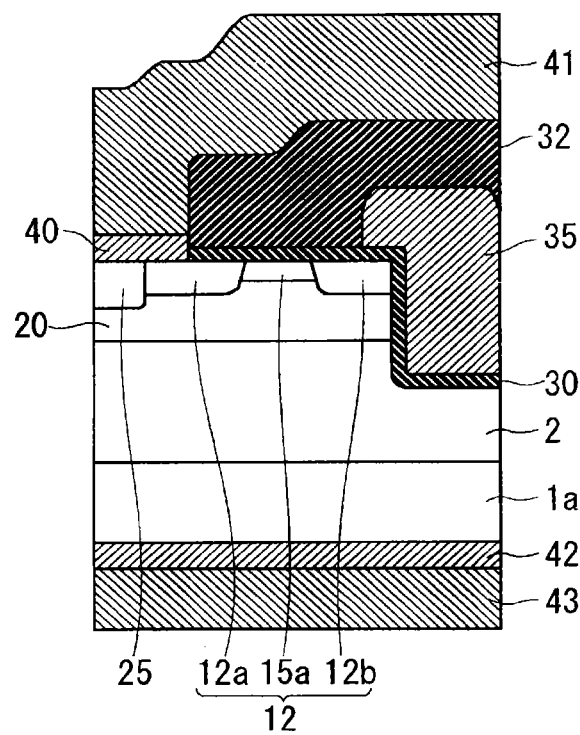
FIG. 36 is a vertical sectional view showing the method of manufacturing the semiconductor device of the fourth embodiment.

Increasing the width of the gate electrode 35 as in FIGS. 36 and 37 advantageously reduces the resistance of the gate electrode 35 to a sufficiently low value. However, this in turn makes the occurrence of a high electric field likely at an edge area of the trench 110 or a MOS structure part at the bottom of the trench 110.

Figure 38:
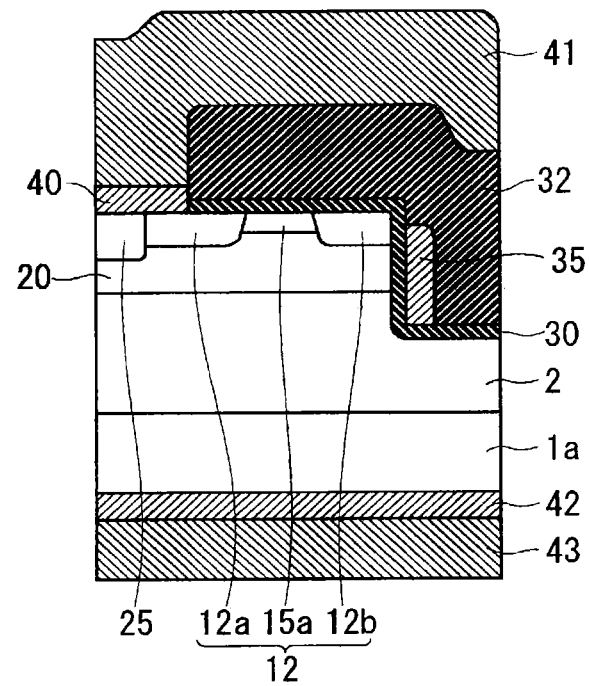
FIG. 38 is a vertical sectional view showing the method of manufacturing the semiconductor device of the fourth embodiment.
Figure 39:
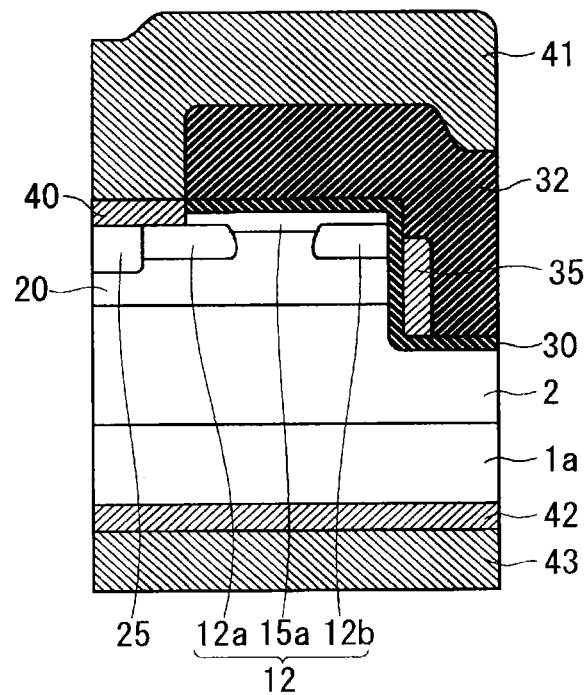
FIG. 39 is a vertical sectional view showing the method of manufacturing the semiconductor device of the fourth embodiment.

Meanwhile, forming the gate electrode 35 only at the side wall of the trench 110 can avoid the aforementioned problem of a high electric field. Further, the gate electrode 35 can be formed by a self-aligned process. This reduces the number of masks, thereby contributing to cost reduction. In FIGS. 38 and 39, the gate electrode 35 is formed so as to be adjacent to the source extension region 12b through the gate insulating film 30 (so as to overlap the source extension region 12b in the lateral direction). This is important in terms of avoiding increase in the channel resistance of the MOSFET.

As described above, the present invention is also applicable to a trench-type MOSFET. Even in this case, the source resistance control region 15a formed in the step different from the step of forming the source contact region 12a and the source extension region 12b is still inserted in series in a path from the channel region in the well region 20 to the ohmic electrode 40 and the source electrode 41. As a result, an effective source resistance can be changed by changing the impurity concentration in the source resistance control region 15a, thereby achieving the same effect as that of the first embodiment. In particular, the trench-type MOSFET does not have the JFET region 11 so it cannot achieve saturation current control using the JFET effect. However, applying the present invention achieves control of a source resistance, thereby allowing control of a saturation current.

Fifth Embodiment

Like in the fourth embodiment, the present invention is applied to a trench-type MOSFET in a fifth embodiment. In the fifth embodiment, the source region 12 has a stacked structure where the source contact region 12a, the source resistance control region 15a, and the source extension region 12b are arranged in the vertical direction (direction vertical to a surface of the drift layer 2 hereinafter also called a "depth direction.")

FIGS. 40 to 45 are views of steps showing a method of manufacturing a trench-type silicon carbide MOSFET as a semiconductor device of this embodiment. FIGS. 40 to 45 correspond to vertical sections of the right half of one of the multiple unit cells 10 arranged in the active region 7. Specifically, FIGS. 40 to 45 do not include the terminal region and show a cross section at an arbitrary position in a region inside the active region 7.

The method of manufacturing the silicon carbide MOSFET of the fifth embodiment is described below.

Figure 40:
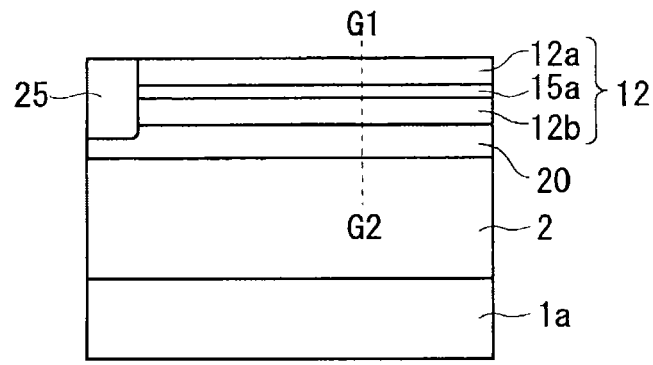
FIG. 40 is a vertical sectional view showing a method of manufacturing a semiconductor device of a fifth embodiment.

After the drift layer 2 is formed on the semiconductor substrate 1a, the well region 20, the source region 12, and the well contact region 25 are formed in the drift layer 2. In this embodiment, the source region 12 is formed into a three-layered structure where the source contact region 12a, the source resistance control region 15a, and the source extension region 12b are arranged in the depth direction as shown in FIG. 40.

The source region 12 of the three-layered structure can be formed by epitaxial growth, ion implantation, or a combination of epitaxial growth and ion implantation. As an example, if the entire source region 12 is to be formed by epitaxial growth, semiconductor of the first conductivity type to become the source extension region 12b is first grown on the well region 20. Then, semiconductor of the first conductivity type to become the source resistance control region 15a is grown on the source extension region 12b. Then, semiconductor of the first conductivity type to become the source contact region 12a is grown on the source resistance control region 15a. For these steps of epitaxial growth, conditions for forming the source contact region 12a, the source resistance control region 15a, and the source extension region 12b are determined appropriately such that each of these regions has a desired impurity concentration and a desired thickness.

Alternatively, the source extension region 12b and the source resistance control region 15a may be formed by epitaxial growth and the source contact region 12a may be formed by ion implantation. Specifically, semiconductor of the first conductivity type to become the source extension region 12b may be grown on the well region 20. Then, semiconductor of the first conductivity type to become the source resistance control region 15a may be grown on the source extension region 12b. Then, impurities of the first conductivity type may be ion implanted into an upper layer area of the source resistance control region 15a to form the source contact region 12a.

The well region 20 may be formed by ion implanting impurities of the second conductivity type into an upper layer area of the drift layer 2 or by epitaxially growing semiconductor of the second conductivity type on the drift layer 2. The well contact region 25 is formed by ion implantation after the source region 12 is formed.

If the source resistance control region 15a is formed by epitaxial growth, the resultant source resistance control region 15a is not affected by the dose of impurities of the second conductivity type in the well region 20, and can be high quality and has a small doping amount while being free from a defect (implantation defect) to occur by ion implantation. As a result, the source resistance control region 15a is to have mobility of high temperature dependence (to exhibit a higher resistance in a higher temperature). The high temperature dependence of the mobility of the source resistance control region 15a enhances the effect of dropping a saturation current in response to heat generated during the occurrence of a short-circuit of an element, for example. This achieves the effect of enhancing the short-circuit tolerance of the MOSFET.

Figure 41:
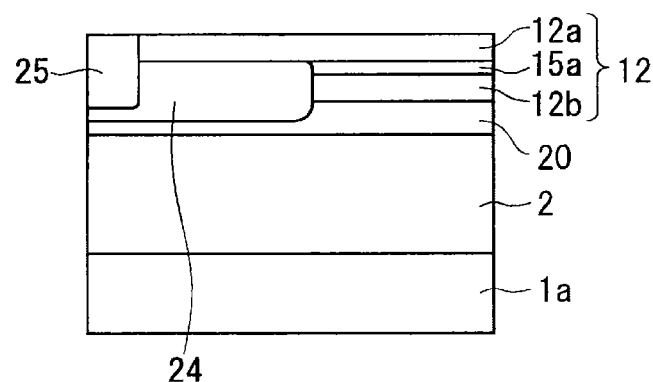
FIG. 41 is a vertical sectional view showing the method of manufacturing the semiconductor device of the fifth embodiment.

After the source region 12 of the three-layered structure is formed by epitaxial growth, an additionally doped well region 24 of the second conductivity type overlapping a part of the source resistance control region 15a and a part of the source extension region 12b may be formed as shown in FIG. 41 by additionally ion implanting impurities of the second conductivity type selectively. Forming the additionally doped well region 24 reduces the width of each of the source resistance control region 15a and the source extension region 12b (width of an ON current path) to increase the resistance of the source resistance control region 15a. This contributes to further enhancement of the short-circuit tolerance of the MOSFET. The additionally doped well region 24 is formed in a position separated from the trench 110 to be formed later.

The entire source region 12 of the three-layered structure may be formed by ion implanting impurities of the first conductivity type. In this case, energy for implanting ions and the dose of the ions to be implanted into the source contact region 12a, the source resistance control region 15a, and the source extension region 12b are determined appropriately such that each of these regions is formed to a desired depth and each of these regions has a desired impurity concentration.

Figure 42:
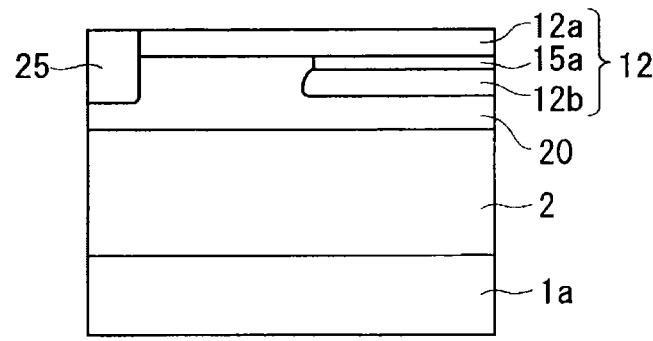
FIG. 42 is a vertical sectional view showing the method of manufacturing the semiconductor device of the fifth embodiment.
Figure 43:
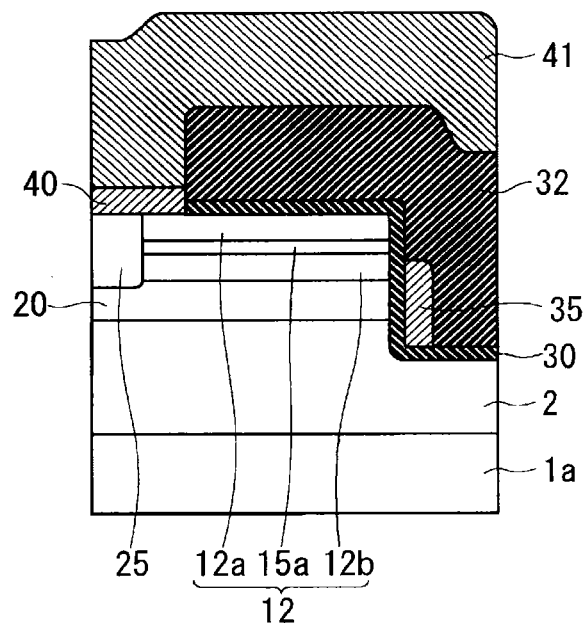
FIG. 43 is a vertical sectional view showing the method of manufacturing the semiconductor device of the fifth embodiment.

In this case, the respective widths of the source resistance control region 15a and the source extension region 12b can be controlled by using an implantation mask. Thus, reducing the width of the source resistance control region 15a without forming the additionally doped well region 24 as shown in FIG. 42 can also contribute to further enhancement of the short-circuit tolerance of the MOSFET.

Figure 46:
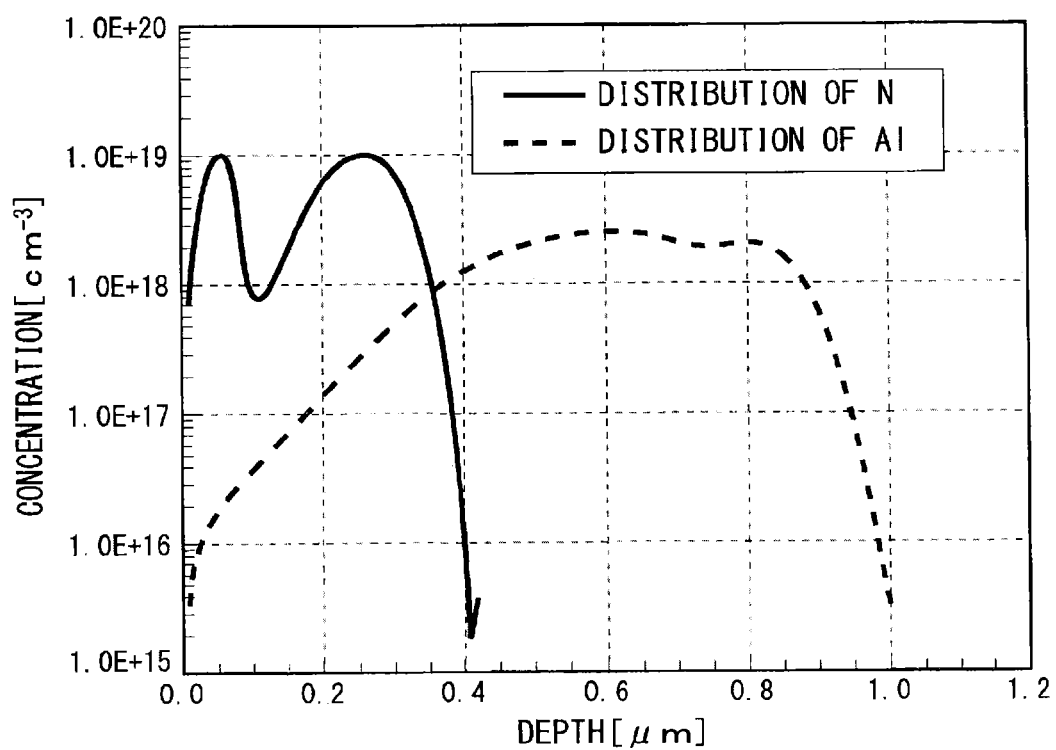
FIG. 46 is a graph showing a result of numerical calculation of a distribution of an impurity concentration in a source region and a well region of the semiconductor device of the fifth embodiment.

FIG. 46 is a graph showing a result of numerical calculation of a distribution of an impurity concentration in the well region 20 and the source region 12 conducted when all the well region 20, the source contact region 12a, the source extension region 12b, and the source resistance control region 15a of the silicon carbide MOSFET of this embodiment are formed by ion implantation. The horizontal axis of the graph of FIG. 46 shows a depth from the surface of the drift layer 2 taken along line G1-G2 of FIG. 40. In this example, nitrogen (N) is used as impurities of the first conductivity type and aluminum (Al) is used as impurities of the second conductivity type.

A region extending to a depth of about 0.35 µm from the surface of the drift layer 2 where the concentration of the impurities (N) of the first conductivity type is higher than that of the impurities (Al) of the second conductivity type corresponds to the source region 12. This region includes a region of a depth from about 0 to about 0.1 µm that corresponds to the source contact region 12a, a region of a depth from about 0.1 to about 0.15 µm that corresponds to the source resistance control region 15a, and a region of a depth from about 0.15 to about 0.35 µm that corresponds to the source extension region 12b. A region of a depth from about 0.35 to about 1.0 µm corresponds to the well region 20.

The thermal diffusion coefficient of impurities in silicon carbide is considerably small so that a distribution of these impurities after being subjected to high temperature process for activation of the impurities is still substantially the same as that obtained at the time when the impurities are implanted. Thus, the impurity distribution such as that shown in FIG. 46 can be obtained easily in the completed MOSFET. In order to reduce an effective impurity concentration of the first conductivity type in the source resistance control region 15a, impurities of the second conductivity type may be implanted additionally to a depth (position at a depth of about 0.1 µm in FIG. 46) where the impurity concentration of the first conductivity type is extremely low.

After the well region 20, the source region 12, and the well contact region 25 are formed, the trench 110, the gate insulating film 30, and the gate electrode 35 are formed by the same technique as that of the fourth embodiment. At this time, the trench 110 is formed so as to pass through the source region 12 and the well region 20 to reach the drift layer 2 under the well region 20. The source region 12 has a structure where the source contact region 12a, the source resistance control region 15a, and the source extension region 12b are stacked in the depth direction. Thus, each of these regions is to reach a side wall of the trench 110. Like in the fourth embodiment, a part of the well region 20 defined between the drift layer 2 under the well region 20 and the source extension region 12b and adjacent to the trench 110 is to become a channel region of this MOSFET.

In this embodiment, the gate electrode 35 is buried entirely in the trench 110. Further, the gate electrode 35 overlaps a part of the source extension region 12b but it does not overlap the source resistance control region 15a (see FIG. 43). Specifically, the gate electrode 35 is formed to extend over the source extension region 12b, the well region 20, and the drift layer 2. The overlap of the gate electrode 35 with the source extension region 12b can avoid increase in the channel resistance of the MOSFET. Preventing overlap of the gate electrode 35 with the source resistance control region 15a can avoid dependence of the effect of the present invention achieved by the source resistance control region 15a on a gate bias.

Next, same procedure as that of the first embodiment is followed to form the interlayer insulating film 32, the ohmic electrode 40, and the source pad 41. As a result, the trench-type silicon carbide MOSFET is obtained having the structure shown in FIG. 43.

Figure 44:
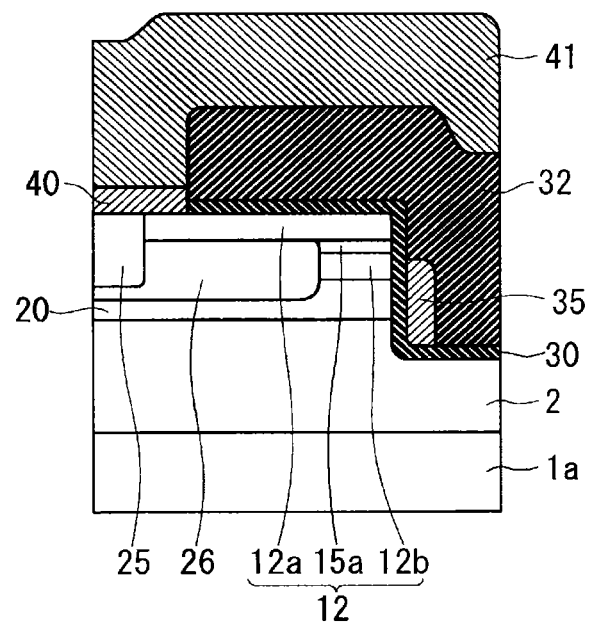
FIG. 44 is a vertical sectional view showing the method of manufacturing the semiconductor device of the fifth embodiment.
Figure 45:
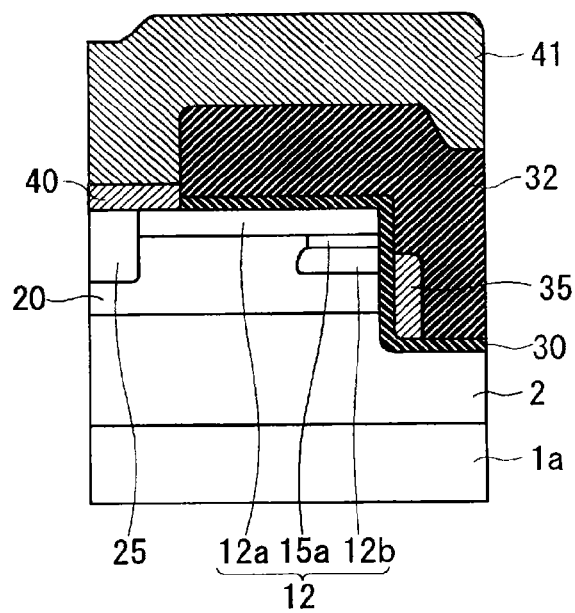
FIG. 45 is a vertical sectional view showing the method of manufacturing the semiconductor device of the fifth embodiment.

Forming the source region 12 into the structure of FIG. 41 provides the silicon carbide MOSFET with the structure of FIG. 44. Forming the gate electrode 35 into the shape of FIG. 42 provides the silicon carbide MOSFET with the structure of FIG. 45.

In the semiconductor device of the fifth embodiment, the source extension region 12b, the source resistance control region 15a, and the source contact region 12a are arranged in the depth direction. As a result, a cell pitch of the unit cells 10 in the lateral direction can be reduced to achieve a high channel density, thereby contributing to reduction in the ON resistance of an element. Further, using epitaxial growth for the source resistance control region 15a can form the source resistance control region 15a into a low impurity concentration region with excellent temperature characteristics and free from implantation defect, so that the short-circuit tolerance of the element can be enhanced further.

In the trench-time silicon carbide MOSFETs shown in the fourth and fifth embodiments, the semiconductor substrate 1a of the first conductivity type may also be replaced by the semiconductor substrate 1b of the second conductivity type (FIG. 18) to form an IGBT structure. The present invention is further applicable to such an IGBT.

The effects achieved by the structures of the semiconductor devices shown in the first to third embodiments are also achieved by semiconductor devices manufactured by different methods as long as these semiconductor devices have the same structures. Further, the embodiments of the present invention can be combined freely or each of the embodiments can be modified or omitted where appropriate without departing from the scope of the invention.

REFERENCE SIGNS LIST

1a Semiconductor substrate
1b Semiconductor substrate
2 Drift layer
5 Chip
7 Active region
10 Unit cell
11 JFET region
12 Source region
12a Source contact region
12b Source extension region
13 Field stop region
15a Source resistance control region
20 Well region
21 Terminal well region
22 High impurity concentration well region
23 Well bridge region
24 Additionally doped well region
25 Well contact region
26 Recess
28 Terminal low-resistance region
30 Gate insulating film
31 Field oxide film
32 Interlayer insulating film
35 Gate electrode
40 Ohmic electrode
42 Ohmic electrode
41 Source pad
43 Drain electrode
44 Gate interconnect
45 Gate pad
50 FLR region
100a, 100b, 100bN, 100c, 101b, 101c, 100cN, 100d, 100dN Implantation mask
101 Corner area of implantation mask
110 Trench

The invention claimed is:

1. A semiconductor device comprising:
a semiconductor substrate;
a drift layer of a first conductivity type formed on said semiconductor substrate;
a well region of a second conductivity type selectively formed in a superficial area of said drift layer;
a source region of said first conductivity type formed in a superficial area in said well region;
a JFET region being a part of said drift layer and adjacent to said well region;
a channel region being a part of said well region and defined between said source region and said JFET region;
a gate electrode arranged over said drift layer while a gate insulating film is arranged between said drift layer and said gate electrode, said gate electrode extending over said source region, said channel region, and said JFET region;
a source electrode connected to said source region; and
a drain electrode formed on a back surface of said semiconductor substrate wherein said source region includes:
a source contact region connected to said source electrode;
a source extension region adjacent to said channel region; and
a source resistance control region arranged between said source extension region and said source contact region, said source resistance control region being lower in an impurity concentration of said first conductivity type than said source extension region and said source contact region,
a distance from a border between said source resistance control region and said source extension region to a border between said source resistance control region and said source contact region equals a distance between said source extension region and said source contact region, and
said gate electrode overlaps only said source extension region of said source region.

2. The semiconductor device according to claim 1, wherein said source contact region and said source extension region have the same distribution of an impurity concentration.

3. The semiconductor device according to claim 1, wherein a distribution of an impurity concentration of said first conductivity type in said source resistance control region changes continuously from said source extension region toward said source contact region.

4. The semiconductor device according to claim 1, wherein an impurity concentration of said first conductivity type in said source resistance control region is smaller than those in said source extension region and said source contact region by an order of magnitude or more.

5. The semiconductor device according to claim 1, wherein said source resistance control region is higher in a sheet resistance than said source extension region and said source contact region.

6. The semiconductor device according to claim 1, wherein said source resistance control region has a uniform length in a direction from said source extension region toward said source contact region.

7. The semiconductor device according to claim 1, wherein said source resistance control region has a length that is twice a length of said channel region or less, said length of said source resistance control region being defined from said source extension region toward said source contact region.

8. A semiconductor device comprising:
a semiconductor substrate;
a drift layer of a first conductivity type formed on said semiconductor substrate;
a well region of a second conductivity type selectively formed in a superficial area of said drift layer;
a trench formed so as to pass through said well region;
a source region of said first conductivity type formed in a superficial area in said well region and at a side wall of said trench;
a channel region being a part of said well region and defined between said source region and said drift region, said part being at said side wall of said trench;
a gate electrode buried in said trench while a gate insulating film is arranged between said drift layer and said gate electrode;
a source electrode connected to said source region; and
a drain electrode formed on a back surface of said semiconductor substrate, wherein said source region includes:
a source contact region connected to said source electrode;
a source extension region adjacent to said channel region; and
a source resistance control region arranged between said source extension region and said source contact region, said source resistance control region being lower in an impurity concentration of said first conductivity type than said source extension region and said source contact region,
a distance from a border between said source resistance control region and said source extension region to a border between said source resistance control region and said source contact region equals a distance between said source extension region and said source contact region, and
said gate electrode faces only said source extension region of said source region.

9. The semiconductor device according to claim 8, wherein said source contact region and said source extension region have the same distribution of an impurity concentration.

10. The semiconductor device according to claim 8, wherein a distribution of an impurity concentration of said first conductivity type in said source resistance control region changes continuously from said source extension region toward said source contact region.

11. The semiconductor device according to claim 8, wherein an impurity concentration of said first conductivity type in said source resistance control region is smaller than those in said source extension region and said source contact region by an order of magnitude or more.

12. The semiconductor device according to claim 8, wherein said source resistance control region is higher in a sheet resistance than said source extension region and said source contact region.

13. The semiconductor device according to claim 8, wherein said source resistance control region has a uniform length in a direction from said source extension region toward said source contact region.

14. The semiconductor device according to claim 8, wherein said source resistance control region has a length that is twice a length of said channel region or less, said length of said source resistance control region being defined from said source extension region toward said source contact region.

15. The semiconductor device according to claim 8, wherein said source extension region, said source resistance control region, and said source contact region exist at said side wall of said trench.

16. The semiconductor device according to claim 1, wherein said source resistance control region is formed so as to have a uniform length in a direction in which an ON current flows.

17. The semiconductor device according to claim 8, wherein said source resistance control region is formed so as to have a uniform length in a direction in which an ON current flows.

* * * * *